(12) United States Patent
Vinson et al.

(10) Patent No.: US 10,928,453 B2
(45) Date of Patent: *Feb. 23, 2021

(54) SYSTEM AND METHOD FOR MONITORING AN ELECTRICAL PATTERN AND PATTERN TRENDS IN ELECTRICALLY DRIVEN SYSTEMS

(71) Applicant: Silverback Advanced Motor Monitoring, LLC, Roanoke, VA (US)

(72) Inventors: Mark Wayland Vinson, Roanoke, VA (US); Raymond M. Hayes, Lancaster, OH (US)

(73) Assignee: Silverback Advanced Motor Monitoring, LLC, Roanoke, VA (US)

( * ) Notice: Subject to any disclaimer, the term of this patent is extended or adjusted under 35 U.S.C. 154(b) by 93 days.

This patent is subject to a terminal disclaimer.

(21) Appl. No.: 16/214,406

(22) Filed: Dec. 10, 2018

(65) Prior Publication Data

US 2019/0128966 A1 May 2, 2019

Related U.S. Application Data

(63) Continuation-in-part of application No. 15/166,612, filed on May 27, 2016, now Pat. No. 10,411,637, and a continuation of application No. 15/588,972, filed on May 8, 2017, now Pat. No. 10,187,003.

(60) Provisional application No. 62/170,850, filed on Jun. 4, 2015.

(51) Int. Cl.
*G01R 31/34* (2020.01)

(52) U.S. Cl.
CPC .................. *G01R 31/343* (2013.01)

(58) Field of Classification Search
CPC .................................... G01R 31/343
See application file for complete search history.

(56) References Cited

U.S. PATENT DOCUMENTS

| | | |
|---|---|---|
| 4,473,338 A | 9/1984 | Gamong |
| 5,629,870 A | 5/1997 | Farag et al. |
| 5,742,522 A | 4/1998 | Yazici et al. |
| 6,014,598 A | 1/2000 | Duyar et al. |
| 6,262,550 B1 | 7/2001 | Kliman et al. |
| 6,297,742 B1 | 10/2001 | Canada et al. |

(Continued)

*Primary Examiner* — Akm Zakaria
(74) *Attorney, Agent, or Firm* — Potomac Law Group, PLLC; Vincent M DeLuca

(57) ABSTRACT

A system obtains respective measurements of relevant electrical parameters of a motor during operational stages including a start-up stage, a transition stage, a steady-state stage, idle stage, or a shutdown stage of the motor driven system driven by the motor. Based on the respective measurements, the monitoring system then determines respective electrical patterns corresponding to the operational stages. Next, the monitoring system compares the respective electrical patterns corresponding to the operational stages with respective baseline electrical patterns modeled for the operational stages to yield a comparison. Then, the monitoring system determines a status of the motor driven system based on a comparison between baseline and observed operating parameters. Trend pattern monitoring is used to eliminate storing massive volumes of trend data by capturing and characterizing the important moments when data values change in a significant manner.

9 Claims, 15 Drawing Sheets

(56) References Cited

U.S. PATENT DOCUMENTS

| | | |
|---|---|---|
| 6,957,172 B2 | 10/2005 | Wegerich |
| 7,199,534 B2 | 4/2007 | Ford et al. |
| 7,755,984 B2 | 7/2010 | Klerk |
| 8,055,370 B1 * | 11/2011 | Achtnig ............ G05B 19/41875 340/3.1 |
| 8,810,173 B2 | 8/2014 | Li et al. |
| 8,892,263 B1 | 11/2014 | Morris et al. |
| 2004/0254750 A1 | 12/2004 | Macfarlene et al. |
| 2005/0034023 A1 | 2/2005 | Maturana et al. |
| 2005/0083206 A1 | 4/2005 | Couch et al. |
| 2008/0187444 A1 | 8/2008 | Molotkov et al. |
| 2010/0169030 A1 * | 7/2010 | Parlos ...................... G01H 1/00 702/58 |
| 2011/0241447 A1 | 10/2011 | Ando et al. |
| 2013/0030765 A1 | 1/2013 | David |
| 2016/0116538 A1 | 4/2016 | Kim et al. |
| 2016/0282416 A1 | 9/2016 | Choi |

* cited by examiner

| CONDITIONS | ELECTRICAL PATTERN PARAMETERS/VALUES |
|---|---|
| AIR FLOW BLOCKAGE | SL DURATION (T2-TI)<br>S3 AVERAGE APPARENT POWER (VOLT-AMPERES) |
| COMPRESSOR REFRIGERANT CHARGE | S1 DURATION<br>S3 AVERAGE APPARENT POWER<br>OUTSIDE AIR TEMPERATURE |
| AGITATOR IMPEDIMENT | S1 DURATION<br>S3 AVERAGE APPARENT POWER<br>S3 TOTAL HARMONIC DISTORTION |
| BEARING WEAR | S3 DISCRETE HARMONIC COMPONENTS |
| COMPACTOR CAPACITY | S1 DURATION AUTOMATIC<br>S1 AVERAGE APPARENT POWER<br>S2 DURATION |
| NON-SPECIFIC MOTOR/SYSTEM HEALTH | INDIVIDUAL STAGE (S1, S2, ETC.) DURATIONS (SECONDS),<br>INDIVIDUAL STAGE TOTAL REAL ENERGY (WATTHOURS),<br>INDIVIDUAL STAGE TOTAL REACTIVE ENERGY (VARHOURS),<br>INDIVIDUAL STAGE HARMONIC DISTORTION (%)<br>INDIVIDUAL STAGE SIGNIFICANT DISCRETE HARMONIC COMPONENTS (% OF FUNDAMENTAL),<br>INDIVIDUAL STAGE SINGLE CYCLE MAXIMUM POWER (WATTS),<br>INDIVIDUAL STAGE SINGLE CYCLE MINIMUM POWER FACTOR (PER UNIT). |

FIG. 5

| COMPARISON OUTPUT | METHODS OF PATTERN BASELINE PARAMETER ESTABLISHMENT |
|---|---|
| % BLOCKAGE (0% = NEW FILTER) | OPERATOR TRIGGERED AUTOMATIC CREATION AT FILTER REPLACEMENT OR OTHER RELEVANT MAINTENANCE ACTIVITIES |
| % CHARGED (100% = OPTIMUM CHARGE LEVEL) | OPERATOR TRIGGERED AUTOMATIC CREATION AFTER ROUTINE MAINTENANCE (KNOWN REFRIGERANT CHARGE) |
| ALARM INDICATIONS OF EXCEEDED LIMITS | OPERATOR TRIGGERED AUTOMATIC CREATION AT KNOWN OPTIMAL STATE |
| ALARM INDICATIONS OF EXCEEDED LIMITS | OPERATOR TRIGGERED AUTOMATIC CREATION AT KNOWN OPTIMAL STATE, OR PRELOADED FROM MANUFACTURERS GUIDELINES |
| CAPACITY (100% = EMPTY) | OPERATOR TRIGGERED AUTOMATIC CREATION AT KNOWN OPTIMAL STATE |
| ALARM INDICATIONS OF EXCEEDED LIMITS | OPERATOR TRIGGERED AUTOMATIC CREATION WHEN SYSTEM IS IN KNOWN OPTIMAL STATE |

*FIG. 5(Continued)*

SYSTEM AND METHOD FOR MONITORING AN ELECTRICAL PATTERN AND PATTERN TRENDS IN ELECTRICALLY DRIVEN SYSTEMS

CROSS-REFERENCE TO RELATED APPLICATIONS

This application is a continuation-in-part under 35 U.S.C. 120 of copending U.S. patent application Ser. No. 15/166,612 filed on May 27, 2016, which claims priority under 35 U.S.C. 119(e) from U.S. Provisional Application No. 62/170,850 filed on Jun. 4, 2015, which applications are incorporated by reference herein in their entireties.

BACKGROUND

Electrical motors have an essential role in modern society. From small fans and compressors that heat and cool our homes to industrial motors that drive large-scale manufacturing processes, electric motors power numerous systems in our society. Not surprisingly, unexpected or unplanned failures of motor-driven systems can have harmful consequences which can result in significant costs and major inconveniences. Unexpected failures of motor-driven systems can require emergency repair, often resulting in unexpected expenses and other challenges.

Operational inefficiencies in motor-driven systems are significant contributors to excessive energy consumption and costs associated with these systems. Such factors can include, for example, bearing friction, clogged filters and pipes, drive-system mechanical misalignment, coolant charge deficiency, and so forth. Unfortunately, a large percentage of such inefficiencies go undiscovered until performance degrades to the point of system failure. Yet, by then, it is often too late to avoid the harmful consequences of a system failure.

Traditional trend monitoring is a well-known and valuable tool to facilitate operation, maintenance, and analysis of various important systems, such as electrical motors described. Examples of continuously monitored variables include electrical load voltage, current and power, as well as industrial process temperatures and pressures, to name a few.

A traditional trend monitoring system starts with a source of data, such as a power meter or temperature sensor. The data source is collected and processed locally (physically near the system to be monitored) continuously to create statistic values, such as average value. Time-stamped values for the predefined trend interval is locally stored (also referred to as data logging). Stored trend data values are periodically transmitted from the local monitoring system to an external system for processing (physically near the personnel who analyze the data). The external system thus accumulates long-term trend data. The external system processes long-term trend data as-needed for analysis and reporting.

The output of the data source is locally fed into some form of data collection device, or logger. Data is typically stored as one or more statistical values (average, maximum, etc.) that represent the value of the data source over a predefined time period, or trend interval. A typical interval time period might be 15 minutes, such that 96 statistical values will be stored, transmitted, and analyzed for each day, for each data source. The resulting accumulated data set can be used to analyze data source trends over time.

Data volume associated with traditional trend monitoring quickly becomes very large and challenging, however. In addition, costs associated with data transmission, storage, and analysis can limit application of trend monitoring in many cases. For example, it may not be practical to apply traditional trend monitoring at trend intervals more frequent than 5 minutes because the resulting data volume rapidly becomes too large.

Moreover, traditional trend monitoring is not intended to capture rapid changes in data. Source data changes that occur significantly faster than the predefined trend interval are very difficult, if not impossible, to detect.

SUMMARY

In a first aspect of the invention, approaches set forth herein can be used to monitor the electrical patterns associated with a motor driven system in order to troubleshoot and diagnose the motor driven system. Various approaches can be implemented for capturing, analyzing, and modeling electrical patterns. For example, in some cases, a system can capture electrical patterns for specific operational stages of a motor-driven system. Actual electrical patterns for the specific operational stages can then be compared to baseline patterns in order to monitor and troubleshoot the various aspects of performance of a motor-driven system, and identify inefficiencies and impending failures. In some cases, the baseline patterns can similarly correspond to specific operational stages of the motor-driven system. For example, a first set of baseline patterns can represent baseline patterns of a first operational stage, such as a start-up stage, and a second set of baseline patterns can represent baseline patterns for a second operation stage, such as a shutdown stage. Thus, the baseline patterns can represent various operational stages for the motor-driven system. Accordingly, when the system compares the actual electrical patterns of the motor-driven system with the baseline electrical patterns of the motor-driven system, it can ensure that actual electrical patterns corresponding to a specific operational stage are compared with baseline electrical patterns corresponding to the same, specific operational stage. This way, the result can provide a snapshot or measurement that is specific to an operational stage of the motor-driven system.

Systems, methods, and non-transitory computer-readable storage media are provided for monitoring electrical patterns of motor-driven systems. The system first obtains respective measurements of voltage and current waveforms from the motor from which power demand, energy consumption, and other derived parameters are calculated for a motor during operational stages including a start-up stage, a transition stage, a steady-state stage, or a shutdown stage. Based on the respective measurements and calculations, the system then determines respective electrical patterns corresponding to the operational stages. Next, the system compares the respective electrical patterns corresponding to the operational stages with respective baseline electrical patterns modeled for the operational stages to yield a comparison. Then, the system determines an estimated status of the motor driven system based on the comparison.

In some embodiments, the system can determine an electrical pattern for a specific stage, such as a start-up stage or a steady-state stage. However, in some embodiments, the system can determine an electrical pattern for multiple stages or based on features extracted from multiple stages. For example, the system can determine an electrical pattern for several stages, such as a start-up stage, a transition stage, and a steady-state stage. The several stages can be sequential or chronological stages within the operational stages of a motor, such as a start-up stage, a transition stage, and a steady state stage, or several stages selected by a system or user for consideration in the computation of the electrical pattern. Thus, an electrical pattern, including a baseline electrical pattern, can be generated from features extracted from a single operational stage or multiple operational stages.

According to a further aspect of the present invention, a method is provided that includes: continuously collecting by a processor, data of a variable at a data source; monitoring for changes in values in the collected data and determining whether a detected change is greater than a predetermined significance factor; responsive to determining that a collected data value is stable by detecting that the change is less than the predetermined value, updating a level matrix with data corresponding to the collected data value; responsive to determining that the collected data value is in transition by detecting that the change is greater than the predetermined value, analyzing data associated with the transition and updating a transition matrix with data corresponding to the collected data value and the analysis; combining data associated with the level matrix with data associated with the transition matrix to form a representation of an operational pattern of the variable; and analyzing the operational pattern to derive an indicator.

According to yet another aspect of the invention, a system is provided for monitoring a trend pattern of a variable, which includes one or more processors, one or more computer-readable tangible storage devices, and program instructions stored on at least one of the one or more storage devices for execution by at least one of the one or more processors, the program instructions including: first program instructions to continuously collect data of the variable at a data source; second program instructions to monitor for changes in values in the collected data and determine whether a detected change is greater than a predetermined significance factor; third program instructions to, responsive to determining that a collected data value is stable by detecting that the change is less than the predetermined value, update a level matrix with data corresponding to the collected data value; fourth program instructions to, responsive to determining that the collected data value is in transition by detecting that the change is greater than the predetermined value, analyze data associated with the transition and update a transition matrix with data corresponding to the collected data value and the analysis; fifth program instructions to combine data associated with the level matrix with data associated with the transition matrix to form a representation of an operational pattern of the variable; and sixth program instructions to analyze the operational pattern to derive an indicator.

According to a still further aspect of the invention, a computer program product is provided that includes one or more computer-readable tangible storage devices, and program instructions stored on at least one of the one or more storage devices, the program instructions include first program instructions to continuously collect data of the variable at a data source; second program instructions to monitor for changes in values in the collected data and determine whether a detected change is greater than a predetermined significance factor; third program instructions to, responsive to determining that a collected data value is stable by detecting that the change is less than the predetermined value, update a level matrix with data corresponding to the collected data value; fourth program instructions to, responsive to determining that the collected data value is in transition by detecting that the change is greater than the predetermined value, analyze data associated with the transition and update a transition matrix with data corresponding to the collected data value and the analysis; fifth program instructions to combine data associated with the level matrix with data associated with the transition matrix to form a representation of an operational pattern of the variable; and sixth program instructions to analyze the operational pattern to derive an indicator.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

FIG. 5 illustrates a table classifying motor-driven system conditions derived from electrical patterns in accordance with an exemplary embodiment;

DETAILED DESCRIPTION

Electrical Pattern Monitoring

Various embodiments of the disclosure are discussed in detail below. While specific implementations are discussed, it should be understood that this is done for illustration purposes only. A person skilled in the relevant art will recognize that other components and configurations may be used without departing from the spirit and scope of the disclosure.

Disclosed are systems, methods, and non-transitory computer-readable storage media for monitoring electrical patterns of motor-driven systems. A brief introductory description of example systems and architectures for monitoring electrical patterns of a motor-driven system are first disclosed herein. A detailed description of monitoring electrical patterns of motor-driven systems, including examples and variations, will then follow. These variations shall be described herein as the various embodiments are set forth. The disclosure now turns to FIG. 1.

Figure 1:
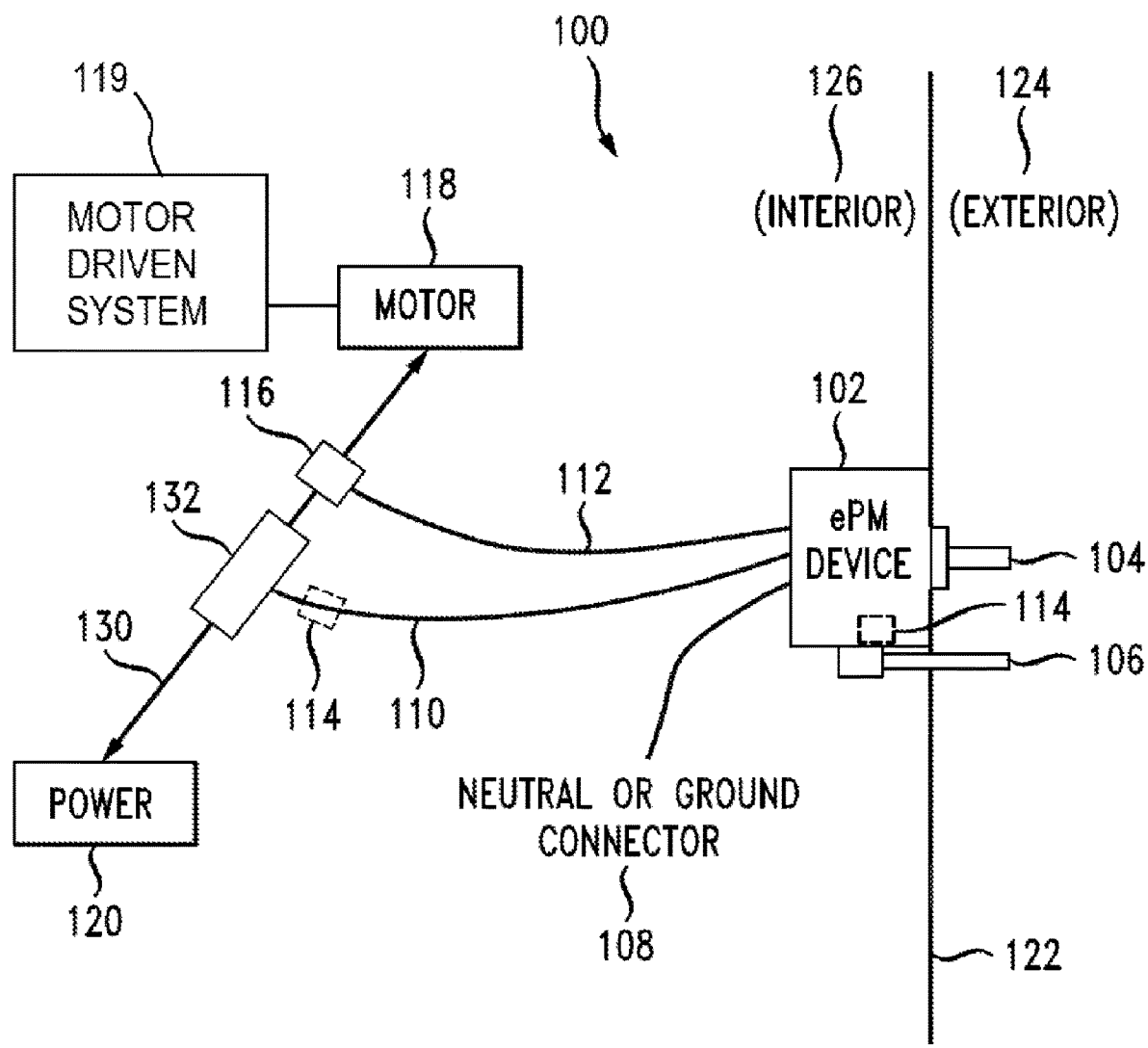
FIG. 1 illustrates a schematic diagram of a system for monitoring electrical patterns of a motor-driven system in accordance with an exemplary embodiment.

FIG. 1 illustrates a system 100 for monitoring electrical patterns of a motor-driven system in accordance with an exemplary embodiment. The system 100 can include an electrical pattern monitor (ePM) device 102 for monitoring electrical patterns of a motor-driven system 119. The ePM device 102 can be a compact monitoring module. In some cases, the ePM device 102 can be fully contained within an electrical enclosure 122, such as an electrical cabinet or a power distribution panel. In some cases, the ePM device 102 can be mounted using, for example, brackets or an existing enclosure conduit knockout.

The ePM device 102 can have an antenna 104, which can extend through an opening of the electrical enclosure 122 so as to be exposed to an exterior 124 of the electrical enclosure 122. The antenna 104 can transmit data; measurements; and/or calculations, such as electrical patterns, diagnostics data, performance or status information, etc.; to a remote location or device, such as centralized location 222 illustrated in FIG. 2 and described below.

In some embodiments, the ePM device 102 can otherwise be mounted on an exterior 124 of the electrical enclosure 122. For example, in some scenarios, the ePM device 102 may be mounted in a different area to accommodate space or signaling challenges. To illustrate, if there is a physical obstruction or signal interference which prevents or diminishes signaling from the antenna 104 on the ePM device 102 to remote locations or devices, the ePM device 102 may be moved to a different location or position to limit or prevent any obstruction or interference to the signaling from the antenna 104. Other constraints or circumstances that may affect the location and/or positioning of the ePM device 102 are also contemplated herein and will be readily recognized by one of ordinary skill in the art.

The antenna 104 can vary based on preferences and/or circumstances. In some embodiments, the antenna 104 can be a low-profile, ruggedized antenna. The type of the antenna 104 can also vary in different embodiments. For example, in some embodiments, the antenna 104 can be a Wi-Fi antenna (i.e., based on IEEE 802.11 standards). In other embodiments, the antenna 104 can be a cellular antenna configured to communicate with a cellular network. As one of ordinary skill in the art will readily recognize, the antenna 104 can be any other type of antenna for data communications. In some embodiments, antenna 104 may be replaced with a hardwire connector for connection to a wired LAN, serial port, or other form of wired digital data connectivity.

The ePM device 102 can include a wire 108 for attachment to ground or to a neutral associated with the enclosure 122 or power source 120. The ePM device 102 can also include one or more wires 112 attached or coupled to one or more sensors 116, such as Hall effect sensors, for measuring one or more power source 120 phases for one or more motor load currents. Sensors 116 can be attached or coupled with motor load wires 130 connecting power source 120 to one or more motors 118, in order to measure or sense currents on the motor load wires 130. Sensors 116 can transmit measured or sensed current levels to the ePM device 102 for use, analysis, and/or storage at the ePM device 102. The motor 118 functionally connected to the motor driven system 119 to drive the motor driven system 119.

The ePM device 102 can also include one or more wires 110 for connecting the ePM device 102 to one or more motor load wires 130 for measuring or sensing one or more motor load voltages. In some cases, the wires 110 can be connected or coupled to the motor load wires 130 using one or more connectors 132, such as an insulation displacement connector (IDC). The ePM device 102 can then measure or sense one or more motor load voltages using one or more sensors 114 for measuring or sensing one or more motor load voltages. The sensors 114 can be attached or coupled to the wire 110, which is then connected to the motor load wires 130 through the connectors 132. Alternatively, the sensors 114 can reside within the ePM device 102 as an internal component for measuring the motor load voltages. In yet other cases, the sensors 114 can be external components connected to the ePM device 102.

In some embodiments, the ePM device 102 can also be supplied with power from a power source 120, via a breaker or a switch, connected to the motor load wire 130. To this end, a connector 132 can couple the wire 110 from the ePM device 102 with the motor load wire 130, to allow the ePM device 102 to obtain power from the power source 120. For example, the ePM device 102 can power an internal power supply (not shown) by feeding power from the power source 120 to the internal power supply through the motor load wire 130, connector 132, and wire 110.

In some embodiments, the motor load wires 130 can include ferrite beads or a core around the motor load wire 130 for suppressing high frequency noise, for example. The motor 118 can be any motor for a motor-driven system, such as a compressor, pump, fan, compactor, heat exchange system, sliding door system, or a device powered by electricity. The ePM device 102 can also include additional sensors, such as backup or alternate sensors, or different types of sensors, such as temperature sensors, photo eye sensors, pressure sensors, flow sensors, IR sensors, etc. Such sensors can be similarly coupled with a wire from the ePM device 102 to allow communication or signaling between the ePM device 102 and the sensors.

The ePM device 102 can include a button, switch, or selector 106 for initiating a self-identification or baseline capture modes, as will be further described below. For example, the ePM device 102 can include a push button to allow a user to initiate a self-identification or baseline capture mode at the ePM device 102. The ePM device 102 can also include other buttons or switches for initiating other procedures or modes. For example, the ePM device 102 can include one or more switches for initiating a waveform capture mode for a specific operational mode, which can be indicated by the switch or switch position. As another example, the ePM device 102 can include a button to initiate the transmission of data from the antenna 104 in order to control when the ePM device 102 may share data or initiate manual cycles for sharing data. Other triggering mechanisms for initiating a self-identification or baseline capture modes are also contemplated herein, such as a sensor for detecting triggering conditions or events, an input device for manually triggering the self-identification and/or capture modes, or a module for triggering the self-identification or capture modes based on a signal or instructions received by a device or component, such as a remote, a sensor, a server, or the centralized location 222.

The ePM device 102 can be used in a wide variety of applications. For example, the ePM device 102 can be implemented for overall motor or motor-driven system monitoring, including compressors, pumps, fans, servos, compactors, etc.; filter air flow sensing, such as blockage detection; pump liquid flow sensing, such as blockage sensing; agitator impediment monitoring; bearing wear monitoring; refrigerant charge sensing, which can include ambient temperature sensing; mechanical alignment or impediment monitoring; compactor capacity sensing; power quality monitoring; etc.

The ePM device 102 can format, package, store, and transmit various types of data, including power demand or energy consumption calculations or values, waveforms, electrical patterns, baseline values or patterns, status information, performance information, reliability information, or any other information relating to power or motor operational characteristics and health.

Figure 2:
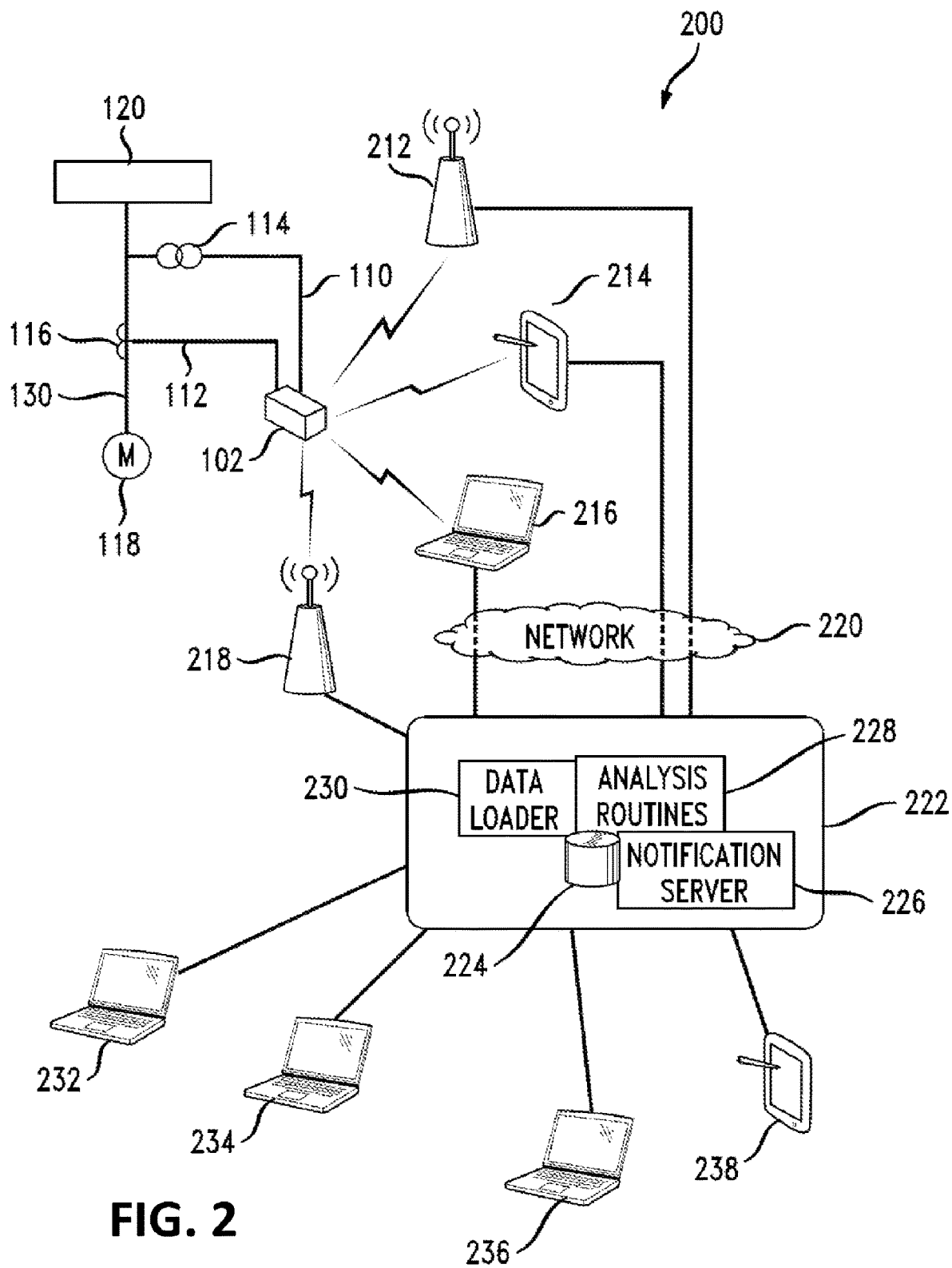
FIG. 2 illustrates a schematic diagram of a network-based architecture for monitoring electrical patterns of a motor-driven system in accordance with an exemplary embodiment.

FIG. 2 illustrates a network-based architecture 200 for monitoring electrical patterns of a motor-driven system in accordance with an exemplary embodiment. The architecture 200 can include an ePM device 102 for measuring and monitoring electrical patterns associated with a motor 118 on a motor-driven system. The ePM device 102 can be attached or coupled with a first sensor 116 through wire 112. As previously explained, the first sensor 116 can measure or sense the motor load current on the motor load wire 130, which can couple the power source 120 with the motor 118. The ePM device 102 can also be attached or coupled with a second sensor 114 through wire 110. The second sensor 114 can measure or sense the motor load voltage, and provide the measurements to the ePM device 102.

The ePM device 102 can obtain one or more motor load current and voltage measurements from the one or more first and second sets of sensors 114 and 116, and wirelessly transmit calculated data, which can include the measurements, to devices 212-218. Each of the first and second sets of sensors 114 and 116 can include one or more sensors. Moreover, the motor 118 can be a DC motor or a 3-phase motor. The ePM device 102 can transmit the calculated data to devices 212-218 through a local area network (LAN). For example, in some cases, the ePM device 102 and devices 212-218 can be communicatively coupled with a Wi-Fi network, and share the calculated data through the Wi-Fi network.

Figure 3:
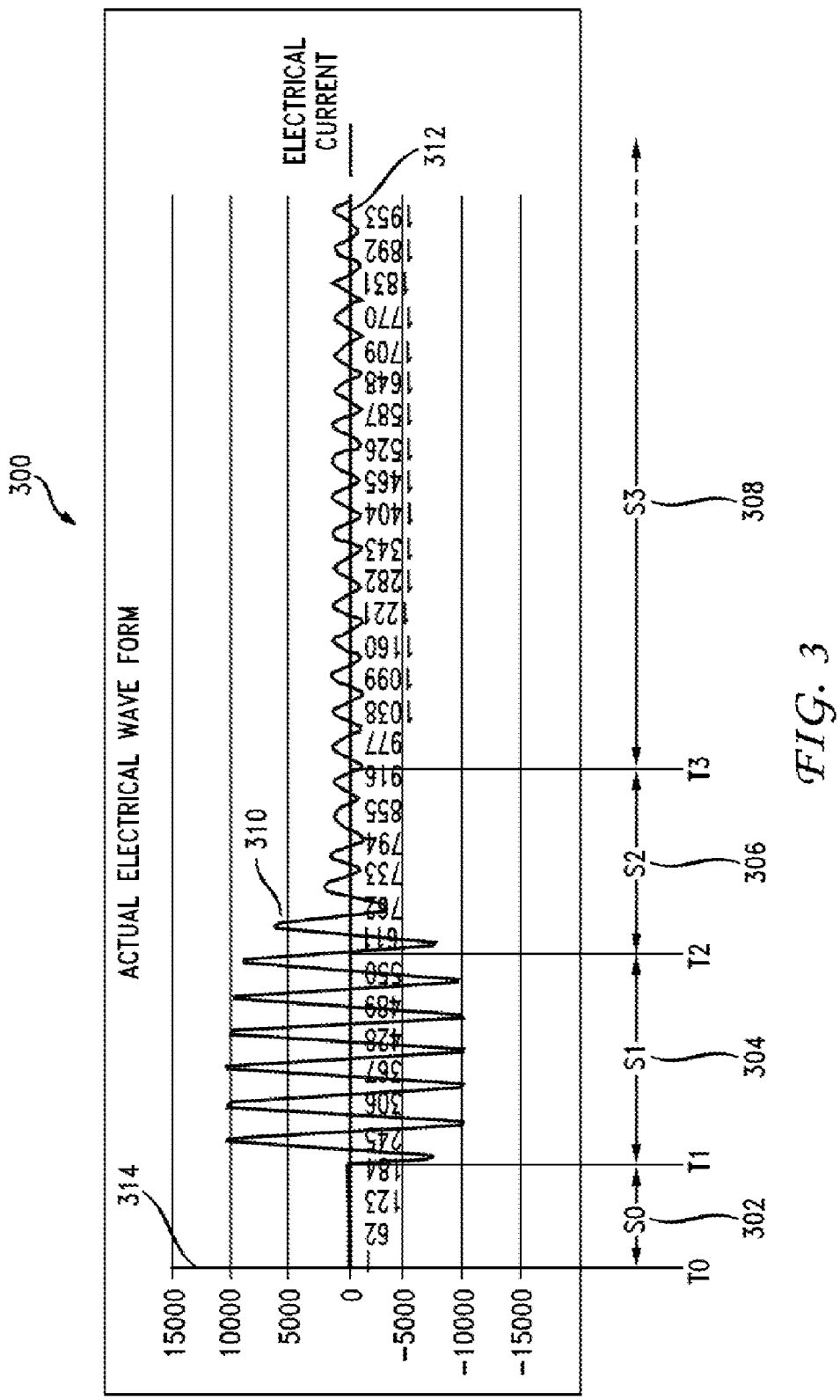
FIG. 3 illustrates a model of a waveform of motor load electric current during operation of a motor-driven system at multiple operational stages in accordance with an exemplary embodiment.
Figure 4:
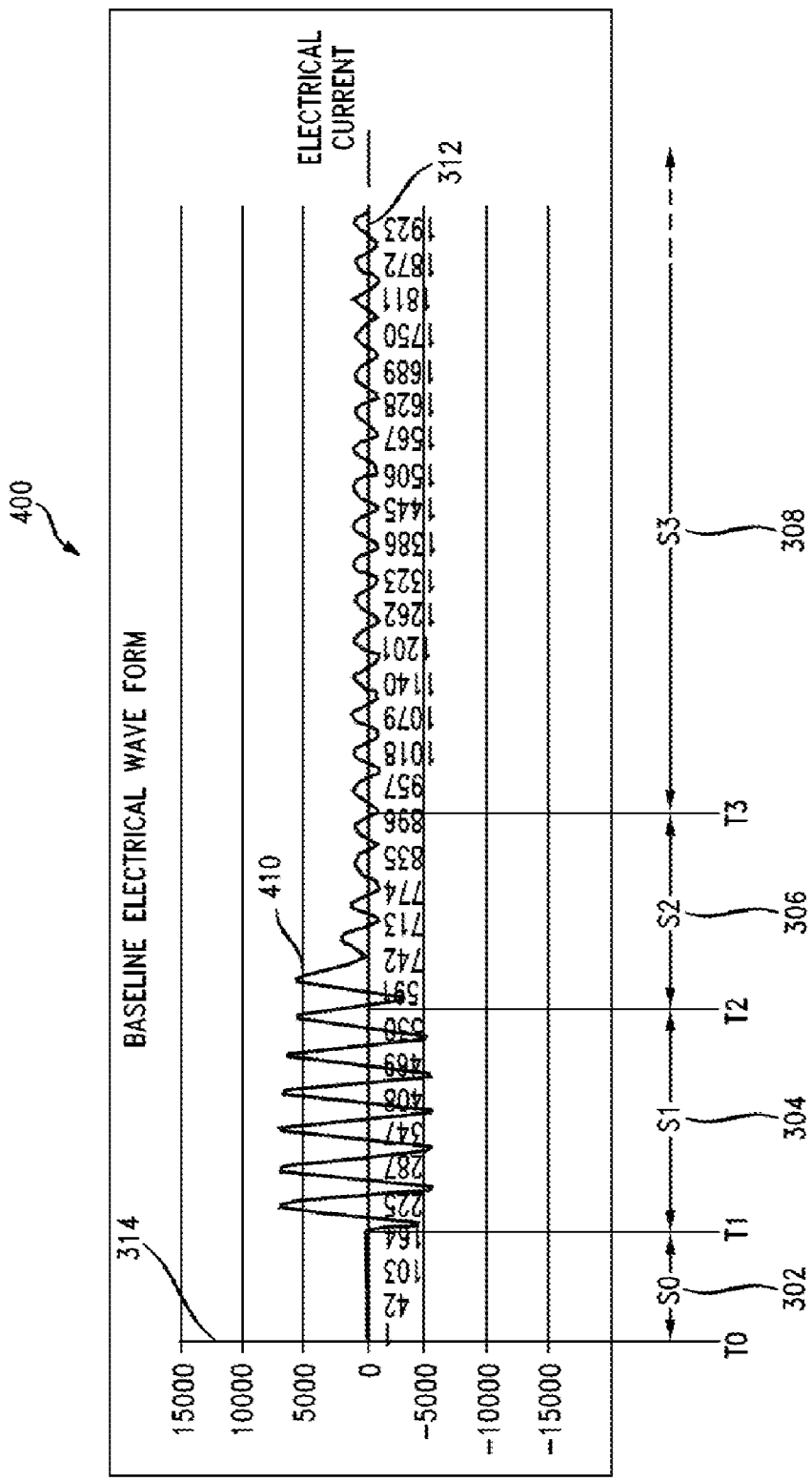
FIG. 4 illustrates a model of a baseline waveform of motor load electric current for a motor-driven system at multiple operational stages in accordance with an exemplary embodiment.

The calculated data transmitted by the ePM device 102 to the devices 212-218 can include actual measurements, baseline measurements, or both. In some cases, the calculated data can also be specific to one or more operational stages, as further described in FIGS. 3 and 4. The calculated data transmitted by the ePM device 102 to the devices 212-218 can include an indication or representation of a condition, state, status, behavior, or pattern of the motor 118. For example, the calculated data can include an electrical pattern or waveform of the motor 118, as illustrated in FIGS. 3 and 4 discussed below, determined by the ePM device 102 based on the measurements from the sensors 114 and/or 116. As another example, the calculated data can include a present condition of the motor 118 or power source 120, such as a power quality or a system capacity, calculated by the ePM device 102 based on the measurements from the sensors 114 and/or 116.

Devices 212-218 can include any device with networking capabilities, such as smartphones, laptops, access points, tablet computers, servers, and so forth. For example, devices 212 and 218 can be access points or wireless routers configured to communicate with the ePM device 102 through a wireless protocol, such as IEEE 802.11, and devices 214 and 216 can be a tablet and laptop computer, respectively.

Devices 212-218 can communicate with a centralized location 222, for sharing data from the ePM device 102 with the centralized location 222. In some cases, the centralized location 222 can be, for example, a centralized network or a cloud environment. Thus, the centralized location 222 can refer to one or more remote locations, devices, and/or networks. Devices 212-218 can communicate with the centralized location 222 through a wireless connection and/or one or more networks. For example, device 218 can communicate with the centralized location 222 directly through a wireless connection. On the other hand, devices 212-216 can communicate with the centralized location 222 through network 220. Network 220 can include a private network, such as a LAN; a public network, such as the Internet; or any combination of private and/or public networks.

The centralized location 222 can include a storage container 224 for storing data and measurements received from the ePM device 102. In some cases, storage container 224 can also store other information pertaining to monitoring services, such as motor and/or system specifications or information, statistics, profiles, account information, previous conditions, baseline values or patterns, system goals, pre-defined patterns or behaviors, behavior characteristics, abnormal behaviors parameterized using feature extraction methods, operating conditions or circumstances, preferences, operational stages and related information or parameters, rules, and so forth. Storage container 224 can include one or more databases, one or more servers, and/or one or more storage devices.

The centralized location 222 can include a notification module 226. The notification module 226 can include one or more servers or components configured to generate notifications and/or alerts. For example, the notification module 226 can generate a notification or alert when it detects an event associated with motor 118, such as a performance irregularity or abnormal behavior. Such notification or alert can be triggered for the event based on a pre-defined threshold or criteria or some degree of deviation from a baseline. For example, the notification module 226 can generate a notification or alert when a performance of the motor 118 indicates an abnormal performance level or condition or some deviation from the baseline. In some cases, a deviation or abnormal behavior can be determined by comparing parameter vectors to classify one or more conditions. For example, various artificial neural network methods can be implemented to compare parameter vectors in order to classify a condition which can trigger a notification.

As another example, the notification module 226 can be configured to generate a notification or alert when a performance of the motor 118 falls below a pre-defined threshold. In some cases, the pre-defined threshold can be adjusted based on specific preferences, circumstances, conditions, a context, a type of motor 118 and/or system, and so forth. Notifications or alerts can also be triggered based on various other events or conditions. For example, a notification can be triggered based on a schedule, a hardware or software modification, a change in a current condition or circumstance, a regression, a timeframe, and so forth. Notifications and/or alerts from the notification module 226 can be transmitted from the centralized location 222 to one or more devices 232-238. In some cases, notifications and/or alerts from the notification module 226 can be transmitted to other networks, such as a remote network or a remote cloud; a remote server, such as a monitoring server; and/or other modules within the centralized location 222, such as a signaling module, for example.

The centralized location 222 can further include an analysis module 228 and a data loader module 230. The data loader module 230 can load compiled data and measurements from the ePM device 102, which the analysis module 228 can use to perform data calculations and electrical monitoring for motor 118. Analysis module 228 can review measurements and data obtained for motor 118 to determine a status, state, or condition of motor 118. For example, analysis module 228 can review performance values measured for motor 118 at specific operational stages and compare the performance values with baseline values for the specific operational stages to determine a current performance of the motor 118 at each of the specific operational stages.

Devices 232-238 can communicate with the centralized location 222 to obtain notifications, alerts, measurements, performance statistics, conditions, evaluations, monitoring results, or any other status information for motor 118. In some cases, the centralized location 222 can actively push information and data to one or more of the devices 232-238. In other cases, the devices 232-238 can request information and data about motor 118 from the centralized location 222 as needed. For example, the centralized location 222 can be a cloud environment where devices 232-238 can access information and data about motor 118 (and/or the system associated with motor 118) through a browser or client application. In some cases, the cloud environment can include a dashboard or user interface that devices 232-238 can access to obtain measurements, performance or status information, conditions, alerts, operation characteristics, and so forth. Devices 232-238 can also use the dashboard or user interface to change monitoring or data parameters, device preferences, error margins, thresholds, baseline values, calculation rules, etc.

Devices 232-238 can be any computing device with networking capabilities, such as a smartphone, a tablet computer, a laptop, a handheld device, a desktop, a server, etc. Devices 232-238 can be associated with individual users or customers, subscribers, partners, researchers, data analysts, equipment managers, technicians, and so forth. Thus, devices 232-238 can allow the various types of users, subscribers, or entities to remotely access data and measurements about the motor 118, and obtain any additional calculations, alerts, or predictions, through the centralized location 222 thereby determining data and conditions of the motor driven system 119 driven by the motor 118. While FIG. 2 illustrates four (4) devices (i.e., devices 232-238), one of ordinary skill in the art will readily recognize that other embodiments may include more or less devices. Indeed, the devices 232-238 are non-limiting example provided for explanation purposes.

In some embodiments, the centralized location 222 can also remotely push settings or parameters to the ePM device 102, or trigger operations at the ePM device 102. For example, the centralized location 222 can receive input, preferences, or parameters from devices 232-238 and, in response, remotely push data to the ePM device 102. The ePM device 102 can receive the data and make any necessary adjustments to the settings, parameters, values, or operations at the ePM device 102.

While FIG. 2 illustrates one (1) ePM device (i.e., ePM device 102), one of ordinary skill in the art will readily recognize that other embodiments may include more ePM devices. For example, some embodiments may include additional ePM devices, each of which can be implemented to monitor the same motor as ePM device 102 (i.e., motor 118) and/or one or more different motors.

FIG. 3 illustrates a model 300 of a waveform 310 of motor load electric current during an operation of a motor-driven system at multiple operational stages in accordance with an exemplary embodiment. The waveform 310 can be used to derive one or more pattern parameters. The model 300 can depict the waveform 310 for a motor, such as motor 118, over an X axis 312 and a Y axis 314. The X axis 312 can represent time or duration values, such as nanoseconds, seconds, minutes, hours, days, weeks, date, time, etc.; or events, such as stages, power demand events, etc. The Y axis 314 can represent measured characteristic values, such as voltage, current, power, or any other electrical characteristics or measurements. The X axis 312 and Y axis 314 can be used to identify characteristics or conditions of the waveform 310 at one or more specific points or periods, such as energy consumption at one or more specific time intervals, for example.

A pattern can refer to specific characteristics of electrical consumption during one or more specific operational phases or stages. In some embodiments, the model 300 can also include multiple operational modeling stages 302-308. For example, the model 300 can include an idle stage (S0) 302, a start-up stage (S1) 304, a transition stage (S2) 306, and a steady-state stage (S3) 308. In some cases, the model 300 can also include other operational stages. For example, the model 300 can include one or more stages following the steady-state stage 308 representing the powering down of motor 118, such as a second transition stage and/or a second shutdown stage of the motor driven system. Other operational stages are also contemplated herein, such as multiple or sub-stages associated with one or more of the multiple operational stages 302-308.

Idle stage 302 can refer to a period where power demand of the motor-driven system is at a low value indicative of the motor 118 being off or inactive. Idle stage 302 can also refer to a period where power demand of the motor-driven system changes from a steady state to a low value as the motor-driven system ends an operational cycle.

Start-up stage 304 can refer to a period where power demand changes from a low value indicative of an inactive system (e.g., idle stage 302), to the beginning of a transition stage 306 which leads to a steady-state stage 308. For example, the start-up stage 304 can occur as the motor-driven system beings an operational cycle from an inactive period (e.g., idle stage 302).

Transition stage 306 can refer to a period where power demand transitions from the start-up stage 304 to the steady-state stage 308. For example, the transition stage 306 can occur after the start-up stage 304 when the motor-driven system begins to settle into a steady-state operation.

Steady-state stage 308 can refer to a period where average power demand and/or deviation indicates that the motor-driven system is at a steady-state operation. In some cases, average power demand and deviation may be pre-configured based on thresholds and/or value ranges. The thresholds and value ranges for the average power demand and deviation may also be obtained by comparing the values generated during the different cycles to identify when a steady-state operation has started and ended. Thresholds and value ranges for the average power demand and deviation may be obtained by performing tests or operating the motor-driven system one or more times to obtain operation statistics. For example, in some cases, the thresholds or value ranges for the average power demand and deviation may be calculated by running the motor-driven system through one or more full cycles (e.g., from a start-up state to an idle state).

In some embodiments, the model 300 may include all of the multiple operational modeling stages 302-308. However, in other embodiments, the model 300 may include less or more operational stages. The number and specific stages included in the model 300 can depend on the application, the motor, the motor-driven system, and/or the desired information about the motor-driven system.

The waveform 310 can include a specified set of derived values for one or more individual modeling stages. Some non-limiting examples of pattern values derived from captured waveforms may include: start-up stage beginning date and/or time, individual stage durations (e.g., seconds), individual stage total real energy (e.g., watt hours), individual stage total reactive energy (e.g., varhours), individual stage harmonic distortion (e.g., percentage), individual stage significant discrete harmonic components (e.g., percent of fundamental), individual stage single cycle maximum power (e.g., watts), individual stage single cycle minimum power factor, etc.

In some embodiments, the model can include other operational stages, such as a shutdown or power down stage. The shutdown or power down stage can refer to a period where power demand of the motor-driven system is at a low value indicative of the motor 118 being off, inactive, or powering down.

FIG. 4 illustrates a model 400 of a baseline waveform 410 of motor load electric current for a motor-driven system at multiple operational stages in accordance with an exemplary embodiment. The baseline waveform 410 can be obtained for the motor-driven system when the motor-driven system is in a known optimal state of repair, or when the motor-driven system is performing according to an expected or desired performance. Moreover, the baseline waveform 410 can be used to derive various baseline pattern parameters for the motor-driven system.

The model 400 can depict the baseline waveform 410 for the motor over X axis 312 and Y axis 314. Like model 300 of waveform 310, model 400 of baseline waveform 410 can also include multiple operational modeling stages 302-308. In some cases, the operational stages modeled for the baseline waveform 410 in model 400 can match those stages modeled for the waveform 310 in model 300, and vice versa.

The baseline waveform 410 can be used to derive baseline pattern parameters which can represent a baseline. The baseline can be a statistical range of derived baseline parameters. In some cases, a startup current (e.g., stage 304 current) can be rated RMS current *X with a variance of Y. The measured startup current can then be converted to parameters, which can then be compared to baseline statistics to obtain a baseline.

In some embodiments, the baseline pattern parameter values derived from baseline waveform 410 can be pre-loaded. For example, the baseline values can be pre-loaded based on manufacturer's specifications for the particular motor, estimated values representing optimal operation, calculated values for other motors of a same type and/or application, predicted values, theoretical values, etc. Baseline values can be pre-loaded manually or obtained from one or more devices. For example, baseline values can be uploaded to the ePM device 102 from the centralized location 222, or vice versa. In other embodiments, the baseline parameter values derived from baseline waveform 410 can be derived from actual operational waveforms associated with the motor or motor-driven system, or any other motor or motor-driven system. For example, the baseline values of baseline waveform 410 can be captured from actual operation of the motor or motor-driven system when the motor and/or motor-driven system are known or estimated to be in good state of repair, after a maintenance event, during an initial or first-time operation, when the motor or motor-driven system is/are operating above a threshold, etc.

In other embodiments, the baseline parameter values derived from baseline waveform 410 can be determined based on a combination of pre-determined values or ranges, values or ranges captured during actual operation, and/or multiple sets of values or ranges captured for multiple operations of the motor or motor-driven system. For example, values can be captured for multiple operations of the motor and motor-driven system, and the baseline parameter values derived from baseline waveform 410 can then be determined based on the various values captured for the multiple operations. Here, the baseline parameter values derived from baseline waveform 410 can be calculated from the multiple operations by determining average values (or average range of values) of the various values captured from the multiple operations, a median value of the various values captured from the multiple operations, a range of values within a standard deviation of the various values, etc.

For example, values can be captured for ten (10) operations of the motor and motor-driven system, and then used to calculate the average or median of the values, which can then be set as the baseline value. This can be performed for each of the multiple stages 302-308. For example, values can be captured for each of the multiple stages 302-308 from ten (10) operations of the motor and motor-driven system to obtain ten (10) values for each of the multiple stages 302-308. Based on the ten (10) values for each of the multiple stages 302-308, a baseline value for each of the multiple stages 302-308 can be calculated based on an average or median, for example, of the ten (10) values captured for each of the multiple stages 302-308. In this scenario, the number of operations performed can also be pre-determined based on one or more factors, such as desired accuracy, observed deviations, sensitivity, economy, etc. In some cases, specific values captured from one or more of the operations can be discarded or ignored. For example, if one or more values captured from the operations seems abnormal or otherwise appears to be an anomaly or uncharacteristic of expected operations, such values can be discarded or ignored to prevent the baseline values from being influenced by such abnormal values.

As previously mentioned, the baseline values can be captured by the ePM device 102. In some embodiments, the ePM device 102 can include a user interface where users can view the captured baseline values and select or discard one or more values, or initiate operations (e.g., average or median) to calculate a baseline value based the captured values or one or more selected values from the captured values. In other embodiments, the ePM device 102 can transmit one or more captured and/or selected values to the centralized location 222, and users can select or discard one or more values from the centralized location 222 for use as the baseline value(s). For example, users can access the values stored at the centralized location 222 through a user interface, such as a web browser or an application interface, and select and/or discard one or more values from the user interface. In some cases, users can login to the centralized location 222 through a web browser to access, modify, select, discard, and/or manipulate baseline values or initiate operations for calculating the baseline value(s) based on one or more measured and/or selected values, as previously explained.

Referring to FIGS. 3 and 4, the models 300 and 400 and the waveforms 310 and 410 can be compared to determine a current state, condition, status, diagnostic, performance, characteristic, or an error of the motor and motor-driven system associated with the models 300 and 400. In some cases, given the desired diagnostic information and/or type of motor-driven system to be monitored, the models 300 and/or 400 can be configured with specific pattern definitions to be applied.

The waveforms 310 and 410 can be captured by a device such as ePM device 102, illustrated in FIG. 1. The ePM device 102 can continuously and/or intermittently capture operational voltage and/or current waveforms for at least one phase of the power supply 120 to target the motor 118. The ePM device 102 can also continuously derive and/or store actual values for the specified pattern for each configured operational stage. The ePM device 102 can also continuously compare actual pattern values with baseline pattern values and/or optimal pattern values (which can be calculated based on a theoretical calculation according to a threshold, for example), to derive various measures of efficiency, reliability, performance, and/or quality. The ePM device 102 can also store the various measures derived for later analysis or transmit such values to a remote location, such as centralized location 222 shown in FIG. 2.

One or more coefficients can be used to derive desired measure from a comparison of the waveform patterns 310 and 410 or any comparison of baseline and actual values. For example, a formula or table of temperature coefficients and/or an ambient air temperature measurement can be used to derive refrigerant charge levels from a comparison of baseline and actual values or waveforms. Other coefficients are also contemplated herein and may depend on the application or desired diagnostic information.

In some cases, thresholds or abnormal behaviors can be established such that actual pattern deviation from baseline may be used as a non-specific indicator that other diagnostic measures should be applied. Deviations of actual and baseline patterns can be analyzed and correlated to variations in reliability, efficiency, or performance, for example.

FIG. 5 illustrates a classification table 500 of motor system conditions and statuses that may be derived from analysis of electrical patterns in accordance with an exemplary embodiment. The classification table 500 can be generated to define specific conditions or statuses 502, which may be derived from relevant electrical pattern parameters 504 by comparisons of actual and baseline patterns. Comparisons may be performed using various analytical techniques to derive actionable outputs 506. Baseline pattern parameters can be initially established or reestablished when appropriate using various methods 508.

For example, in some embodiments, an air flow filter blockage condition 510A may be derived by using various analytical techniques to compare relevant actual and baseline pattern parameters 512A. The pattern parameters 512A, which can be derived from measurements of voltage and current waveforms, can include the duration of the startup operational stage S1 304 (values T2 minus values T1) and the average apparent power of the steady state operational stage S3 308, for example. The comparison technique can produce output values 514A, which can represent % blockage. The output values 514A (i.e., the % blockage) can be used by operators of the motor-driven system to determine when an air filter should be replaced, or to otherwise assess efficiency. At the point in time when a filter is replaced, method 516A can be executed to establish or reestablish the baseline parameters. For example, an operator can trigger the ePM device 102 using push button/selector 106 to reestablish the baseline parameters by deriving new baseline parameter values for the next one or more operational sequences of the motor-driven system, which can include each relevant operation stage (at least S1 and S3).

In some embodiments, a compressor refrigerant charge 510B can be derived by comparing the actual and baseline pattern parameters 512B. The pattern parameters 512B can include, for example, stage S1 304 duration, the average apparent power of the steady state operational stage S3 308, and the outside air temperature. The comparison can produce output 514B, which can represent a % charged level. Method 516B can then be executed to establish or reestablish the pattern baseline parameters. For example, an operator can trigger the ePM device 102, using e.g., push button 106, automatic creation after routine maintenance (e.g., known refrigerant charge).

In some embodiments, an agitator impediment 510C can be derived by comparing the actual and baseline pattern parameters 512C. The pattern parameters 512C can include, for example, stage S1 304 duration, the average apparent power of the steady state operational stage S3 308, and the steady state operational stage S3 308 total harmonic distortion. The comparison can produce output 514C, which can represent alarm indications of exceed limits. Method 516C can be executed to establish or reestablish the pattern baseline parameters. For example, an operator can trigger the ePM device 102, using e.g., push button 106, automatic creation known optimal state.

In some embodiments, a bearing wear 510D can be derived by comparing the actual and baseline pattern parameters 512D, which can include, for example, the steady state operational stage S3 308 discrete harmonic components. The comparison can produce output 514D, which can represent alarm indications of exceeded limits. Method 516D can then be executed to establish or reestablish the pattern baseline parameters at known optimal state.

In some embodiments, a compactor capacity 510E can be derived by comparing the actual and baseline pattern parameters 512E, which can include, for example, stage S1 304 duration, the stage S1 304 average apparent power, and the stage S2 306 duration. The comparison can produce output 514E, which can represent a % capacity of the compactor. Method 516E can then be executed to establish or reestablish the pattern baseline parameters at known optimal state.

In some embodiments, other overall motor and system health condition 510F can be derived by comparing the actual and baseline pattern parameters 512F, which can include, for example, durations of the various operational stages, e.g., stages S1-S3 304-308, individual stage total real energy, individual stage total reactive energy, individual stage harmonic distortion, individual stage significant discrete harmonic components, individual stage single cycle maximum power, and/or individual stage singly cycle minimum power factor. The comparison can produce output 514F, which can represent alarm indications of exceeded limits. Method 516F can then be executed to establish or reestablish the pattern baseline parameters at known optimal state.

The conditions 502, parameters 504, outputs 506, and methods 508 are non-limiting examples provided for explanation purposes. As one of ordinary skill in the art will readily recognize, the conditions 502, parameters 504, outputs 506, and/or methods 508 can vary in other embodiments based on one or more factors, such as type of motor or motor-driven system, system configurations, applications, preferences, context or circumstances, etc. For example, the type of conditions 502 can depend based on applications, context, desired diagnostic information, motor-driven system, motor used by motor-driven system, etc. The parameters 504 associated with the conditions 502 can depend for each condition based on the type of condition, the complexity of the condition, the desired sensitivity or accuracy, the type of motor, granularity, context, status, and so forth.

The parameters 504 can be obtained from observed behaviors, predetermined values, captured during operation, calculated based on one or more factors, etc. In some cases, the parameters 504 can be classified into one or more operating classifications, models, and/or types of behavior, which can be based on features extracted from a pattern, such as a representation of captured data. Observed behaviors may be parameterized using feature extraction methods. Feature extraction can include the calculation of derived values such as THD, VPeak, StartTime, etc. These values can represent features of captured raw data. As one of ordinary skill in the art will readily recognize from this disclosure, there can be one or more features depending on the specific application.

Figure 6:
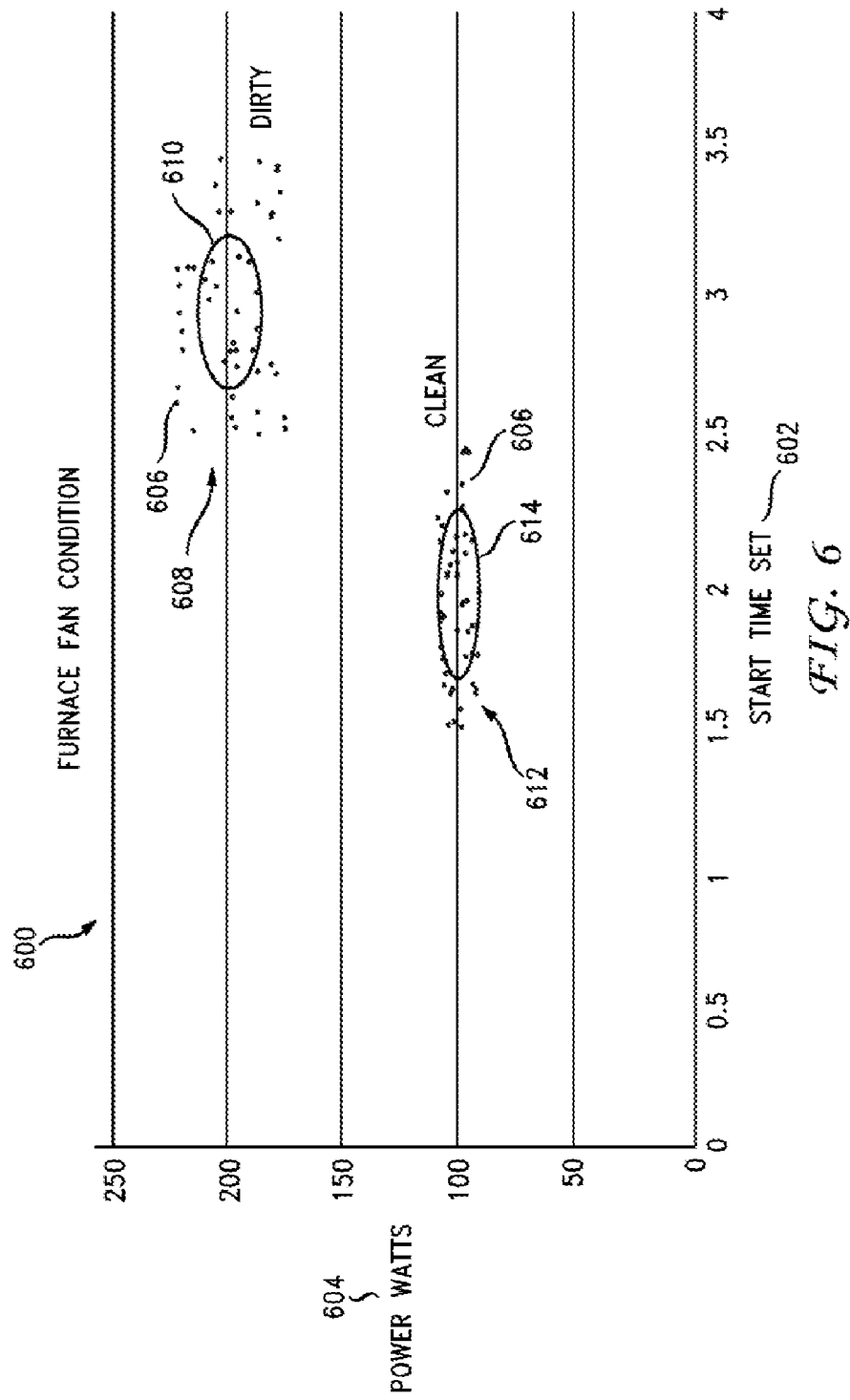
FIG. 6 illustrates a graph of example feature patterns and classifications of a furnace fan condition in accordance with an exemplary embodiment.

FIG. 6 illustrates a graph 600 of example feature patterns and classifications of a furnace fan condition in accordance with an exemplary embodiment. The graph 600 can include measured data points 606 captured by an ePM device 102 for a furnace fan. The data points 606 can represent power watts 604 over start time 602. The data points 606 can represent a capture of raw data by the ePM device 102. The capture can include extracted features 608 and 612 which can represent patterns. A grouping of similar patterns or extracted features can represent classifications 610 and 614.

Classification 610 can represent a dirty furnace fan condition and classification 614 can represent a clean furnace fan condition. The classification 610 for the dirty furnace fan condition can be derived based on a comparison between actual and baseline electrical pattern parameters or values. In some cases, the classification 610 can be identified based on a model or table of conditions, such as table 500 shown in FIG. 5.

The classification 614 for the clean furnace condition can be similarly derived based on a comparison between actual and baseline electrical pattern parameters or values. In some cases, the classification 614 can be based on parameters derived from an electrical waveform of the furnace fan motor while operating in an optimal state of repair or condition.

In some embodiments, the graph 600 can be created based on one or more measurements or derived parameters than those described above with respect to FIG. 6.

Figure 7:
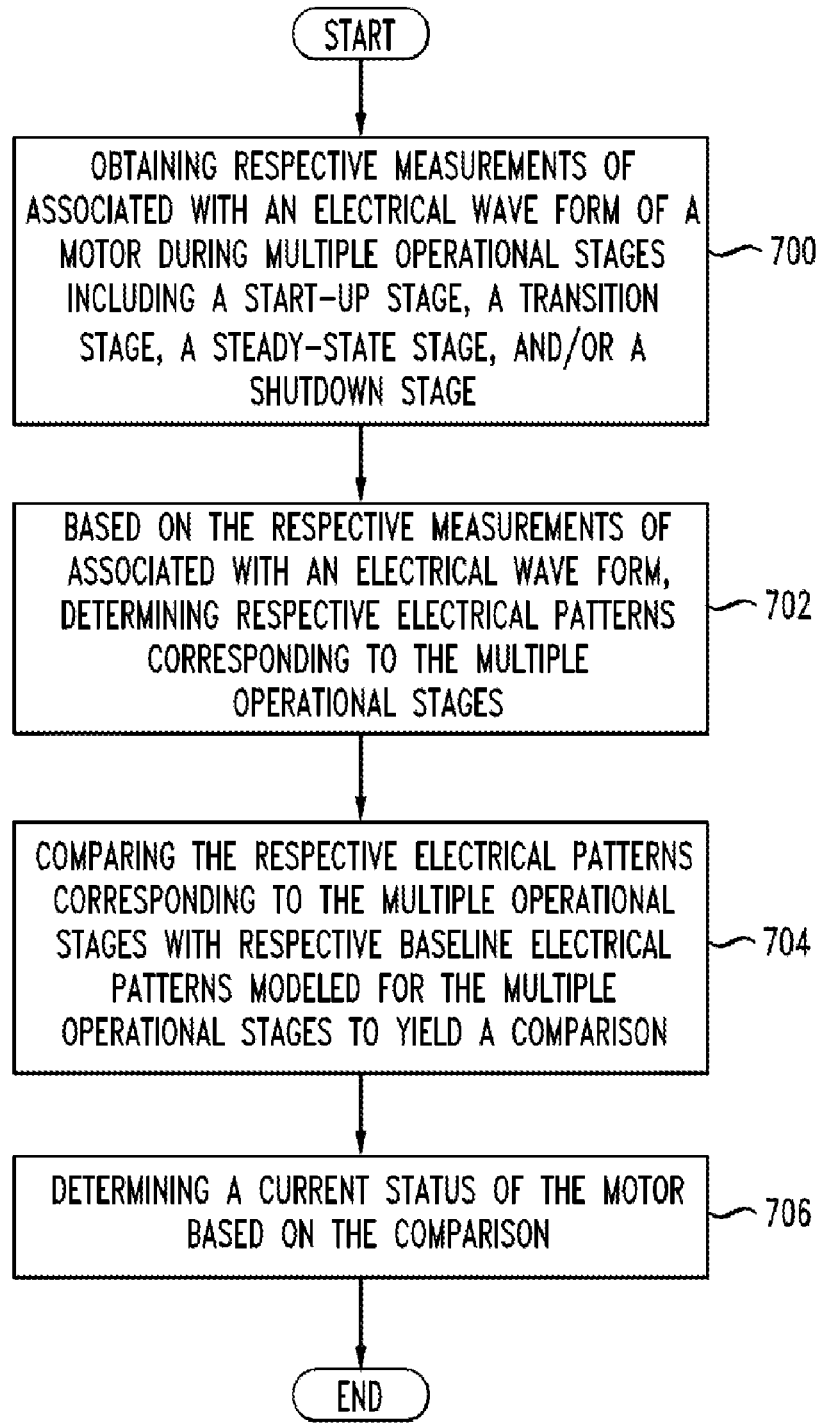
FIG. 7 illustrates a flow diagram of an example method for monitoring electrical patterns of a motor-driven system in accordance with an exemplary embodiment.

Having disclosed some basic system components and concepts, the disclosure now turns to an exemplary method shown in FIG. 7. For the sake of clarity, the method is described in terms of ePM device 102, as shown in FIGS. 1 and 2, configured to practice the method. The steps outlined herein are exemplary and can be implemented in any combination thereof, including combinations that exclude, add, or modify certain steps.

FIG. 7 illustrates a method for monitoring electrical patterns of a motor-driven system in accordance with an exemplary embodiment. The ePM device 102 first obtains respective measurements associated with one or more electrical waveforms of a motor during operational stages including a start-up stage, a transition stage, a steady-state stage, and/or an idle stage (700). The respective measurements associated with one or more electrical waveforms can be, for example, measurements of performance-relevant waveforms, such as voltage and current. The respective measurements can refer to measured or capture values or parameters, but can also include derived values or parameters, such as derived values of power demand and/or energy consumption. The motor can be any motor in a motor-driven system, such as motor 118 illustrated in FIG. 1. For example, the motor can be an electric motor in a ventilation air filter system, a fluid pumping system, a heat exchange system, a compacting system, a sliding door system, a vehicle, a power tool, etc. The idle stage, start-up stage, transition stage, and steady-state stage can refer to the multiple operational stages 302-308 described above with reference to FIGS. 3 and 4.

The ePM device 102 can receive the respective measurements from one or more sensors, such as sensors 114 and 116 illustrated in FIG. 1. However, in some cases, the ePM device 102 can measure one or more of the respective measurements itself. For example, the ePM device 102 can be equipped with one or more sensors for obtaining measurements of power demand.

The ePM device 102 can capture the respective measurements in response to a triggering event, such as an activation of a button (e.g., push button 106), a schedule, a preference, a signal from a device (e.g., a signal from centralized location 222), a user input, etc. Also, the respective measurements can each correspond to one of the operational stages, including the idle stage, the start-up stage, the transition stage, the steady-state stage, and/or a shutdown stage. The respective measurements and/or derived calculations can include specific characteristics of power demand and energy consumption such as, for example, voltage measurements, current measurements, watts, duration, date/time data, total energy, harmonic distortion, maximum power, minimum power factor, discrete harmonic components, etc.

The respective measurements, including any derived quantities, can include, for example, a stage-specific beginning time or date, a stage-specific duration, a stage-specific total real energy, a stage-specific total reactive energy, a stage-specific harmonic distortion, a stage-specific discrete harmonic component, a stage-specific cycle maximum power, and/or a stage-specific cycle minimum power. In some embodiments, the respective measurements can include a motor load voltage and/or a motor load current.

Based on the respective measurements (i.e., any measurements and/or derived calculations), the ePM device 102 then determines respective electrical patterns corresponding to the operational stages (702). The ePM device 102 can generate or model a waveform or electrical pattern for each of the operational stages, or a single waveform or electrical pattern that corresponds to all of the operational stages. The respective electrical patterns can be in the form of one or more waves, charts, tables, matrices, lists, lines, etc. For example, an electrical pattern for a start-up stage can be a list of attributes or characteristics captured, observed, and/or derived during the start-up stage, which can include power demand and energy consumption attributes, duration attributes, ratios, etc.

Next, the ePM device 102 compares the respective electrical patterns corresponding to the operational stages with respective baseline electrical patterns modeled for the operational stages to yield a comparison (704). The respective baseline electrical patterns can be modeled based on predetermined baseline values for each of the specific operational stages, baseline or operation values provided by a manufacturer or manual, and/or values measured and/or derived during an operation at each of the specific operational stages and identified as baseline values. For example, in some embodiments, the respective baseline electrical patterns can be modeled based on measurements sensed by a sensor associated with the ePM device 102. Such sensor can be a component of the ePM device 102 or a separate sensor in communication with the ePM device 102. In some embodiments, the respective baseline electrical patterns can be modeled based on measurements captured by one or more sensors associated with the ePM device 102 and values or calculations derived by the ePM device 102 based on the captured measurements. The measurements can be identified as baseline values as previously described with respect to FIG. 4.

In some embodiments, the ePM device 102, or a sensor associated with the ePM device 102, such as sensor 114 and/or sensor 116, can capture the baseline measurements of the motor corresponding to the operational stages when the motor is operating above a threshold performance level or according to an operational condition or state, such as an optimal state of repair or performance. The threshold performance level or the operational condition or state can be used to ensure that baseline measurements represent the motor when performing at a specific level or performance.

In other embodiments, the ePM device 102, or a sensor associated with the ePM device 102, such as sensor 114 and/or sensor 116, can capture the baseline measurements of the motor corresponding to the operational stages at a specific time of interest, such as after a maintenance or repair, after an initial or first operation, etc. The specific time for capturing the baseline measurements can differ from the time when the respective measurements of power consumption are obtained. For example, in some cases, the baseline measurements are captured prior to a time when the respective measurements are obtained by the ePM device 102 for the motor. The specific time for capturing the baseline measurements can be selected based on a usage history of the motor, a current or prior status of the motor, a current or prior performance of the motor, a maintenance or repair status of the motor, a context, a number or amount of usage of the motor, a predicted performance of the motor, etc.

Then, the ePM device 102 determines a status of the motor based on the comparison (706). The status can include a state, classification, condition, performance, reliability, quality, or behavior. For example, depending on the specific application and/or desired diagnostic information, the status can specify a blockage level, a charge level, a capacity level, a performance level, an error, a reliability estimate, and so forth. The ePM device 102 can also generate an alert, message, or notification based on the determined status. For example, if the status indicates a blockage, the ePM device 102 can generate an alarm or notification to indicate the blockage. The alarm or notification can be a visual or audio alert at the ePM device 102 (e.g., a message or an audio alert) and/or a signal to a remote device, such as centralized location 222 shown in FIG. 2.

In some cases, the ePM device 102 can determine an efficiency and/or reliability of a motor or motor-driven system based on electrical patterns and power consumption calculations. In some embodiments, the ePM device 102 can determine an efficiency and/or reliability of a motor or motor-driven system based on the quality of the electrical supply voltage. In determining the status of a motor, the ePM device 102 can compute one or more of the following power quality quantities: supply voltage RMS value, poly-phase voltage imbalance, supply voltage sag event detection, including event date and/or time, event duration, and event ½ cycle minimum RMS value.

The ePM device 102 can perform single-phase electric power waveform sensing. This can include line voltage sensing and line current sensing. In some embodiments, line voltage sensing can be 120 to 480 V rms with insulation displacement connection (IDC wire-tapping mechanism) to a motor load wire (or parallel), plus a neutral or ground connection wire. In some embodiments, the line current sensing can sense 100 amp peak, using a transformer or Hall effect sensor on motor load conductor.

Voltage and current sensing can be adjusted or implemented within a specific threshold accuracy (or estimated accuracy). In some cases, waveform sensing can handle fundamental frequencies from near DC (VFD low end) to 60 Hertz, including harmonic content to 15 times fundamental. A specific number or range of samples collected per second for waveform sensing can be performed over a time period. For example, in some cases, sensing can be set to a minimum of 8,000 samples per second, or to a specific rate best suited to data analysis needs.

The ePM device 102 can store the current status, the respective electrical patterns, the respective baseline electrical patterns, and/or any measured values locally at a memory or storage device on the ePM device 102 or otherwise communicatively coupled with the ePM device 102. The ePM device 102 can transmit the current status, the respective electrical patterns, the respective baseline electrical patterns, and/or any measured values to a remote system, such as centralized location 222 illustrated in FIG. 2. In some cases, the ePM device 102 can prepare and/or format the data for transmission. For example, the ePM device 102 can package the data as one or more comma separated values (CSV) files, spreadsheet files, compressed files or folders, etc.

In some cases, the ePM device 102 can prepare, generate, format, package, store, and/or transmit event waveform files. The event waveform files can include operational start-up events ("S" files), which can contain the waveform data from which start-up stage 304, transition stage 306, and steady-state stage 308 are derived. The event waveform files can also include operational steady-state periodic samples ("P" files), which can contain the waveform data from which subsequent steady-state values are derived. The event waveform files can include operational shut-down events ("E" files), which can contain the waveform data from which shut-down values are derived. In some cases, event waveform files can include one or more channels of time-stamped waveform samples for one or more phases or stages of motor power supply. The one or more channels can include supply voltage and motor load current. Optionally, all phases or stages can be monitored for poly-phase electric motors.

The ePM device 102 can transmit the event waveform files to a remote device or location, such as centralized location 222 illustrated in FIG. 2. The ePM device 102 can transmit the event waveform files in response to a request from a user and/or device, in response to an event, based on a schedule or interval, as new data and/or measurements are obtained, and/or as the event waveform files are created or prepared. For example, the ePM device 102 can transmit the event waveform files to the centralized location 222 upon a request/instruction from the centralized location 222 and/or automatically as the event waveform files are generated.

The ePM device 102 can also transmit the status, the respective electrical patterns, the respective baseline electrical patterns, and/or any computed values to a remote device or location, such as centralized location 222 illustrated in FIG. 2. The ePM device 102 can transmit such data automatically as it obtains, measures, and/or calculates it. In some embodiments, the ePM device 102 can transmit such data to centralized location 222 in response to a user input or request, an event, and/or a device instruction or request (e.g., a request from the centralized location 222). In other embodiments, the ePM device 102 can transmit such data to centralized location 222 based on a schedule or time interval. Centralized location 222 can receive such data and generate a notification or alert in response to receiving the data. In some embodiments, the centralized location 222 can receive the data from the ePM device 102 and generate a notification or alert based on a characteristic of the data. For example, the centralized location 222 can generate an alert when the data indicates an abnormal behavior and/or when one or more values contained in the data are below a pre-determined threshold.

After generating the notification or alert, the centralized location 222 can transmit the notification or alert to one or more remote users or devices, such as devices 232-238. In some embodiments, the centralized location 222 can store the notification or alert and provide or present the notification or alert to a user when the user attempts to access data about the motor 118 from the centralized location 222 from a user interface, such as a web browser. For example, a user or subscriber may login to a web page from the centralized location 222 to access data and statistics about the motor 118 and subsequently receive an alert or notification via the web page based on the notification or alert generated by the centralized location 222.

Figure 8:
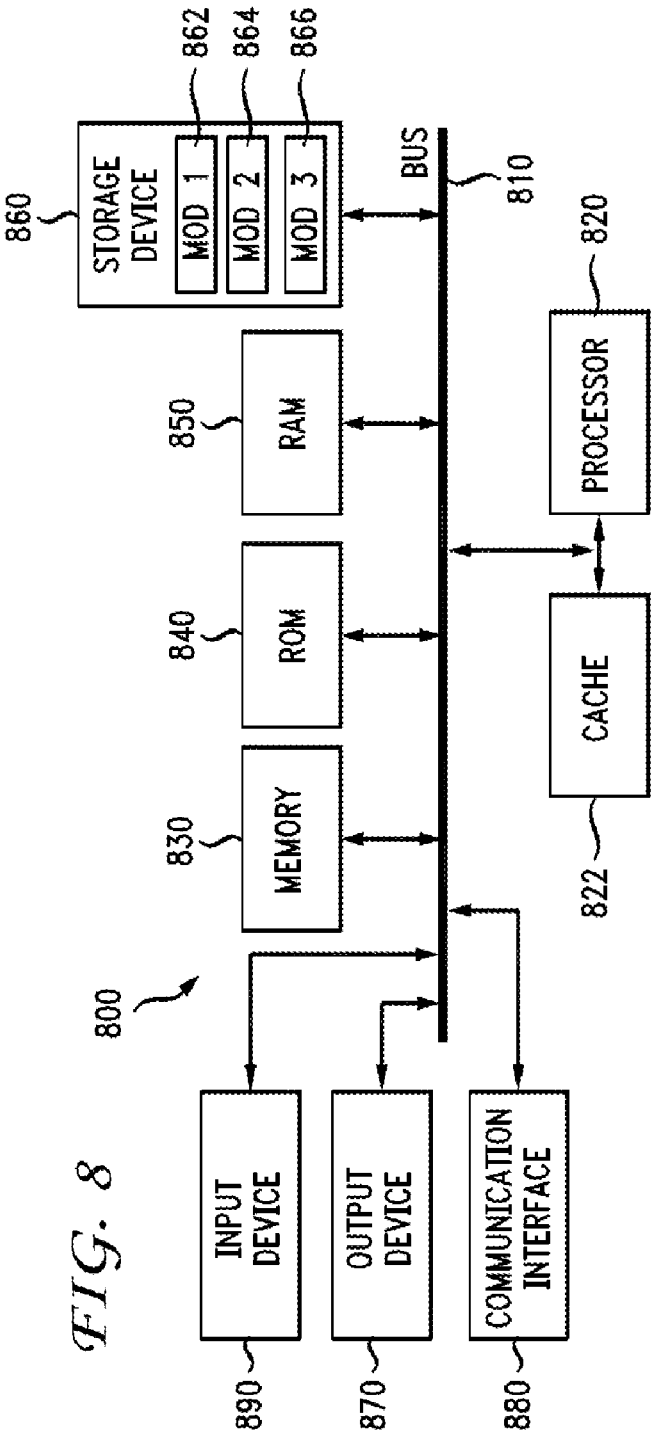
FIG. 8 illustrates a schematic diagram of a system in accordance with an exemplary embodiment.

FIG. 8 illustrates a schematic diagram of system 800 in accordance with an exemplary embodiment. The system 800 can include a processing unit (CPU or processor) 820 and a system bus 810 that couples various system components including the system memory 830, such as read only memory (ROM) 840 and random access memory (RAM) 850, to the processor 820. The system 800 can include a cache 822 of high-speed memory coupled with, in close proximity to, or integrated as part of the processor 820. The system 800 copies data from the memory 830 and/or the storage device 860 to the cache 822 for quick access by the processor 820. In this way, the cache provides a performance boost that avoids processor 820 delays while waiting for data. These and other modules can control or be configured to control the processor 820 to perform various operations or actions. Other system memory 830 may be available for use as well. The memory 830 can include multiple different types of memory with different performance characteristics. It can be appreciated that the disclosure may operate on a computing device 800 with more than one processor 820 or on a group or cluster of computing devices networked together to provide greater processing capability. The processor 820 can include any general purpose processor and a hardware module or software module, such as module 1 862, module 2 864, and module 3 866 stored in storage device 860, configured to control the processor 820 as well as a special-purpose processor where software instructions are incorporated into the processor. The processor 820 may be a self-contained computing system, containing multiple cores or processors, a bus, memory controller, cache, etc. A multi-core processor may be symmetric or asymmetric. The processor 820 can include multiple processors, such as a system having multiple, physically separate processors in different sockets, or a system having multiple processor cores on a single physical chip. Similarly, the processor 820 can include multiple distributed processors located in multiple separate computing devices, but working together such as via a communications network. Multiple processors or processor cores can share resources such as memory 830 or the cache 822, or can operate using independent resources. The processor 820 can include one or more of a state machine, an application specific integrated circuit (ASIC), or a programmable gate array (PGA) including a field PGA.

The system bus 810 may be any of several types of bus structures including a memory bus or memory controller, a peripheral bus, and a local bus using any of a variety of bus architectures. A basic input/output (BIOS) stored in ROM 840 or the like, may provide the basic routine that helps to transfer information between elements within the computing device 800, such as during start-up. The computing device 800 further includes storage devices 860 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device 860 can include software modules 862, 864, 866 for controlling the processor 820. The system 800 can include other hardware or software modules. The storage device 860 is connected to the system bus 810 by a drive interface. The drives and the associated computer-readable storage devices provide nonvolatile storage of computer-readable instructions, data structures, program modules and other data for the computing device 800. In one aspect, a hardware module that performs a particular function includes the software component stored in a tangible computer-readable storage device in connection with the necessary hardware components, such as the processor 820, bus 810, display 870, and so forth, to carry out a particular function. In another aspect, the system can use a processor and computer-readable storage device to store instructions which, when executed by the processor, cause the processor to perform operations, a method or other specific actions. The basic components and appropriate variations can be modified depending on the type of device, such as whether the device 800 is a small, handheld computing device, a desktop computer, or a computer server. When the processor 820 executes instructions to perform "operations", the processor 820 can perform the operations directly and/or facilitate, direct, or cooperate with another device or component to perform the operations.

Although the exemplary embodiment(s) described herein employs the hard disk 860, other types of computer-readable storage devices which can store data that are accessible by a computer, such as magnetic cassettes, flash memory cards, digital versatile disks (DVDs), cartridges, random access memories (RAMs) 850, read only memory (ROM) 840, a cable containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 800, an input device 890 represents any number of input mechanisms, such as a microphone for speech, a touch-sensitive screen for gesture or graphical input, keyboard, mouse, motion input, speech and so forth. An output device 870 can also be one or more of a number of output mechanisms known to those of skill in the art. In some instances, multimodal systems enable a user to provide multiple types of input to communicate with the computing device 800. The communications interface 880 generally governs and manages the user input and system output. There is no restriction on operating on any particular hardware arrangement and therefore the basic hardware depicted may easily be substituted for improved hardware or firmware arrangements as they are developed.

For clarity of explanation, the illustrative system embodiment is presented as including individual functional blocks including functional blocks labeled as a "processor" or processor 820. The functions these blocks represent may be provided through the use of either shared or dedicated hardware, including, but not limited to, hardware capable of executing software and hardware, such as a processor 820, that is purpose-built to operate as an equivalent to software executing on a general purpose processor. For example the functions of one or more processors presented in FIG. 8 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 840 for storing software performing the operations described below, and random access memory (RAM) 850 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 800 shown in FIG. 8 can practice all or part of the recited methods, can be a part of the recited systems, and/or can operate according to instructions in the recited tangible computer-readable storage devices. Such logical operations can be implemented as modules configured to control the processor 820 to perform particular functions according to the programming of the module. For example, FIG. 8 illustrates three modules Mod1 862, Mod2 864 and Mod3 866 which are modules configured to control the processor 820. These modules may be stored on the storage device 860 and loaded into RAM 850 or memory 830 at runtime or may be stored in other computer-readable memory locations.

One or more parts of the example computing device 800, up to and including the entire computing device 800, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization compute layer can operate on top of a physical compute layer. The virtualization compute layer can include one or more of a virtual machine, an overlay network, a hypervisor, virtual switching, and any other virtualization application.

The processor 820 can include all types of processors disclosed herein, including a virtual processor. However, when referring to a virtual processor, the processor 820 includes the software components associated with executing the virtual processor in a virtualization layer and underlying hardware necessary to execute the virtualization layer. The system 800 can include a physical or virtual processor 820 that receive instructions stored in a computer-readable storage device, which cause the processor 820 to perform certain operations. When referring to a virtual processor 820, the system also includes the underlying physical hardware executing the virtual processor 820.

Trend Pattern Monitoring

Trend pattern monitoring described herein is a data processing technique for use within systems that continuously monitor one or more physical parameter variables. Trend pattern monitoring is intended to reduce requirements for data transmission, storage, and analysis when compared to traditional trend monitoring, while also facilitating more detailed analysis of significant changes in data.

Although trend pattern monitoring is described herein with reference to an exemplary technique to implement electrical pattern monitoring (e.g. a technique to derive diagnostic and efficiency indicators for systems driven by electric motors), it should be appreciated that aspects of this technique, referred to in this document as "trend pattern monitoring," can also be applied more generally to significantly reduce the volume of data that must be stored, transmitted, and analyzed for many types of continuous monitoring, while also enabling more detailed analysis of significant data changes.

Trend pattern monitoring is a new approach to trend monitoring that can significantly reduce data transmission, storage, and analysis requirements while facilitating more detailed analysis of changes in data value. Trend pattern monitoring changes the focus of continuous monitoring from storing massive volumes of trend data to capturing and characterizing the important moments when data values change. The concept is similar to the notion of report by exception in that the idea of reporting when something has occurred that is likely to be an indicator that something of interest has occurred.

Figure 9:
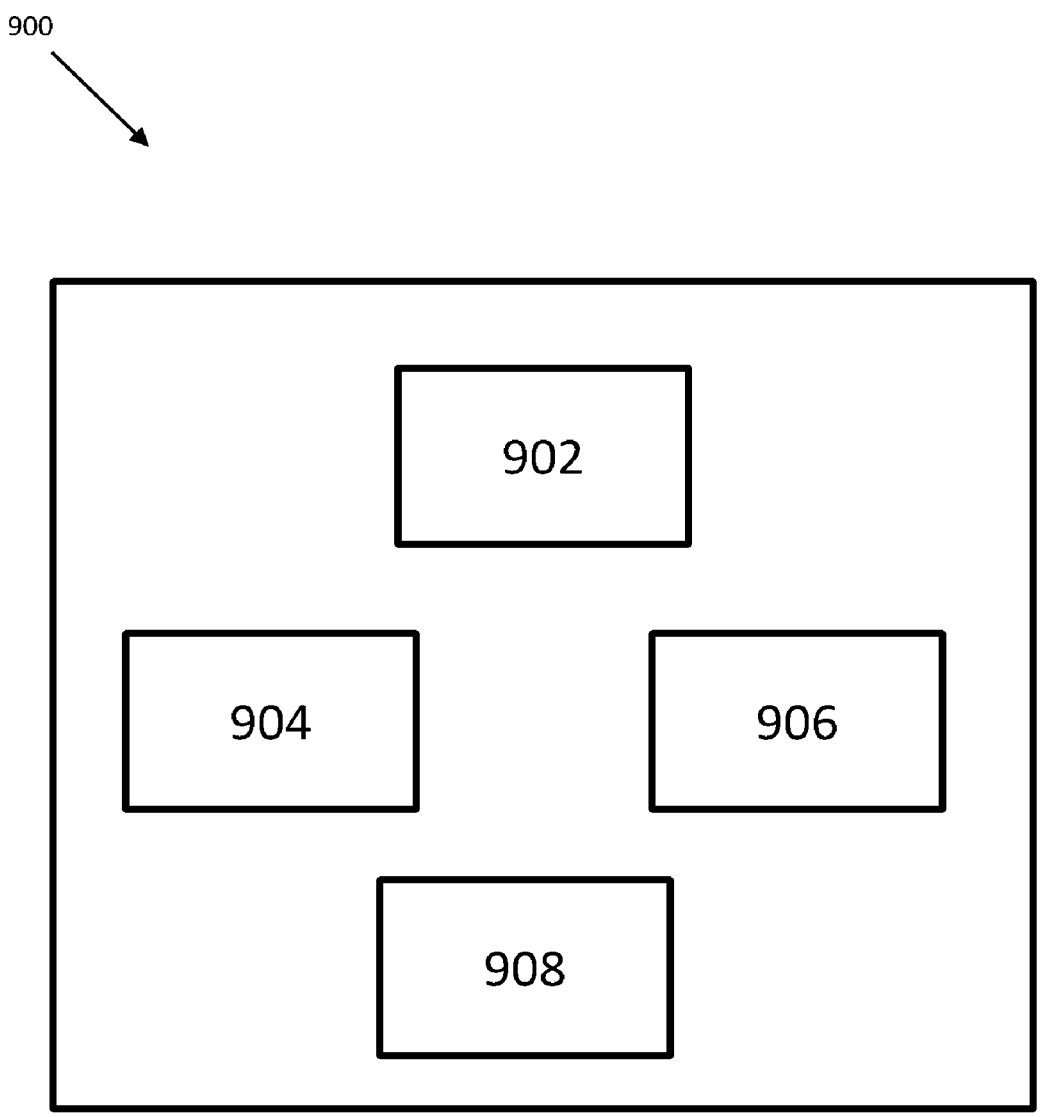
FIG. 9 illustrates an example trend pattern monitoring system in accordance with an exemplary embodiment.

FIG. 9 illustrates an example system 900 for monitoring a trend pattern of a variable. The system 900 includes a data collection program module 902 for collecting and processing the source data continuously in order to detect significant and relevant changes. The system 900 includes a stable level program module 904 for locally creating or updating statistics for each distinct stable value level. The system 900 further includes a transition program module 906 for locally analyzing transitional data between successive stable levels, for identifying features and characteristics of the transitional period, and for locally creating or updating statistics for each unique transition type. The system further 900 includes a trend pattern module 908 for combining the stable level data and the transitional data to form a data representation of an operational pattern of the variable and to transmit the data representation of the operational pattern to an external system for analysis and reporting.

Figure 10:
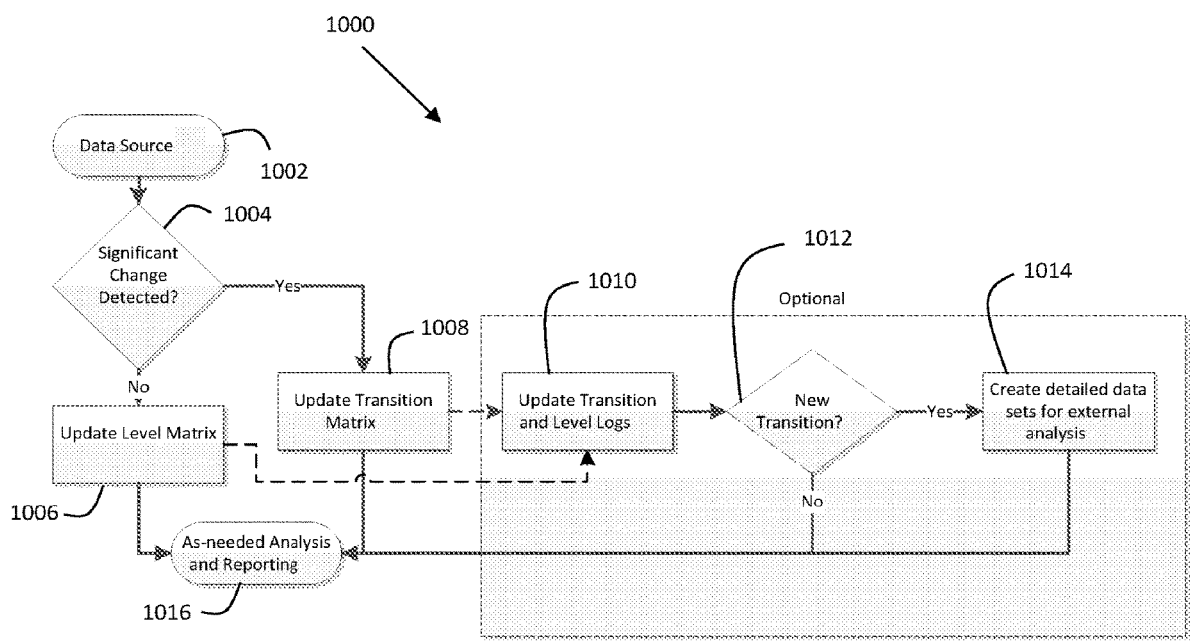
FIG. 10 illustrates an example trend pattern monitoring method in accordance with an exemplary embodiment.

FIG. 10 illustrates a method 1000 for monitoring a trend pattern of a variable, as performed by the system 900 of FIG. 9. At step 1002, source data is continuously collected and processed. In one example, this is done locally at the data source. At step 1004, a determination is made whether a significant or relevant change in the data being collected has occurred. If a significant change has not been detected in step 1004, meaning that the data is stable, then statistics for a stable value level matrix is locally created or updated in step 1006. In particular, statistics for each distinct stable value level are either created or updated. If a significant change has been detected at step 1004, then transitional data between successive stable levels is locally analyzed, at step 1008, to identify features and characteristics of the transitional period, and locally create or update statistics for each unique transition type in a transition matrix. In one example, at step 1010, chronological transition and level logs are locally updated. This file could include appropriate values, with indication of date and time, for each update of level and transition matrices. Such data could be used when needed to create a more traditional trend monitoring data representation from pattern data files. It could also be used to facilitate more detailed analysis of trends over time.

In one example, if it is determined at step 1012 that a transition like this one has not been previously detected, then detailed data sets are locally created as needed for additional external analysis at step 1014. At step 1016, when appropriate and as determined by application specific requirements, pattern and optional data sets are transmitted to external systems for analysis and reporting.

It should be appreciated that trend pattern monitoring reduces continuous trends to small pattern matrices, and enables monitoring resources to be primarily focused on relevant changes. A level matrix contains accumulated statistical values associated with characteristics for each discrete "level" of stable trend data. A transition matrix contains accumulated statistical values associated with characteristics for each unique transition between discrete levels of stable trend data. A trend pattern consists of at least one level matrix and one transition matrix, but might also include optional logs and detailed data sets. It should be obvious that trend pattern monitoring can be easily combined with traditional trend monitoring techniques when beneficial. Aspects of trend pattern monitoring will now be explained in more detail.

Transitions

The trend pattern concept starts with a detection algorithm that automatically detects significant data level changes and automatically performs detailed analysis of transitional periods between stable data levels. Transition periods may include, for example: data value increase from insignificance (from approximately zero); significant value increases or decrease (relevant change); and data value decrease to insignificance (to approximately zero).

It should be appreciated that in many cases, valuable information about the system that is being monitored can be ascertained by analyzing these transition periods in detail.

A detection algorithm automatically detects identifying features of transitional periods. These features might include, for example: Spikes, Surges, Sags, Value increases (or ramps-ups), and Value decreases (or ramp-downs).

Characteristics of each feature are quantified as they occur by attributes which may include, for example: Duration, Maximum, Minimum, Begin value, Ending value, Total energy, as well as other various spectral quantities such as Harmonic distortion.

The resulting collection of transitional features, with associated characteristics, is stored as a representation for each unique transition type. When a transition is detected which matches a previously captured transition type, accumulated statistics for feature/characteristic values are updated for that type of transition, including values such as: Maximum, Minimum, Average, Standard deviation, and Count (i.e. how many times this type of transition has been detected).

Levels

Periods between transitions, where the monitored variable is relatively stable in value, are called "levels". Levels are continuously monitored and characterized. Characterizations might include, for example: Level base value, Spectral distortion, and Top spectral components, including value and frequency.

Accumulated statistics for characteristic values for each level are continuously updated, including values such as, for example: Maximum, Minimum, Average, Standard deviation, and Count.

Patterns

The transition data set, combined with the level data set, provide a very compact and powerful representation of the operational "pattern" of the variable being continuously monitored. Variations in one or more pattern characteristic values can be used to derive various indicators concerning the associated system, such as reliability and efficiency. Patterns can be saved as baselines when operational state is well-known. These baselines can be used for automatic comparison to on-going patterns such that diagnostic indicators can be derived in real time.

Optional Log and Detailed Data Sets

In one example, when needed, optional log data sets can be used with level and transition matrices data to create more traditional chronological trend data sets from pattern data sets. Optional detailed data sets can be analyzed to discover data characteristics that are not immediately obvious from the level and transition matrices. As relevant data characteristics are discovered, the detection algorithm can be modified to incorporate these characteristics in future level and transition matrices.

Application Example

The system and method for monitoring a trend pattern of a variable will be further appreciated with reference to an example application. The following is a hypothetical simple application example of the trend pattern monitoring technique, provided for instructional purposes. This example will start with a very simple hypothetical data set and three definitions of known system parameters, including a "significance factor", a "surge factor, and a "ramp factor", and show how trend pattern processing would proceed to produce resulting trend pattern data sets. It will be obvious to appropriate practitioners that this example is for illustrative purposes and that the specific processing and calculations provided in this example may be much simpler than what will be required in actual applications. This simplicity is deliberate to facilitate instruction, allowing the critical concepts to be readily observed. In practice, the need for more complex processing and calculations will be obvious to appropriate practitioners.

Givens—Data Source Values and System Factors

The example referenced herein is based on the following given data. Although it should be appreciated that alternative values and factors may be substituted. The example data set includes thirty two (32) consecutive 15 minute average values 1102, as illustrated in data graph 1100 of FIG. 11 and also illustrated in the first column of Table 1 below. It should be appreciated that the example data set is produced by a suitable data source and collected by data collection program module 902 of FIG. 9. In addition to the example data set, it is given for this example that the significant (relevant) change is indicated by a change in data value (delta) of more than 2 between any two consecutive data values. This value is referred to as the "significance factor". Also given are the "surge factor" which equals 1.5, and the "ramp factor" which equals 2. These additional two values will be used in the analysis of the transitions.

Figure 11:
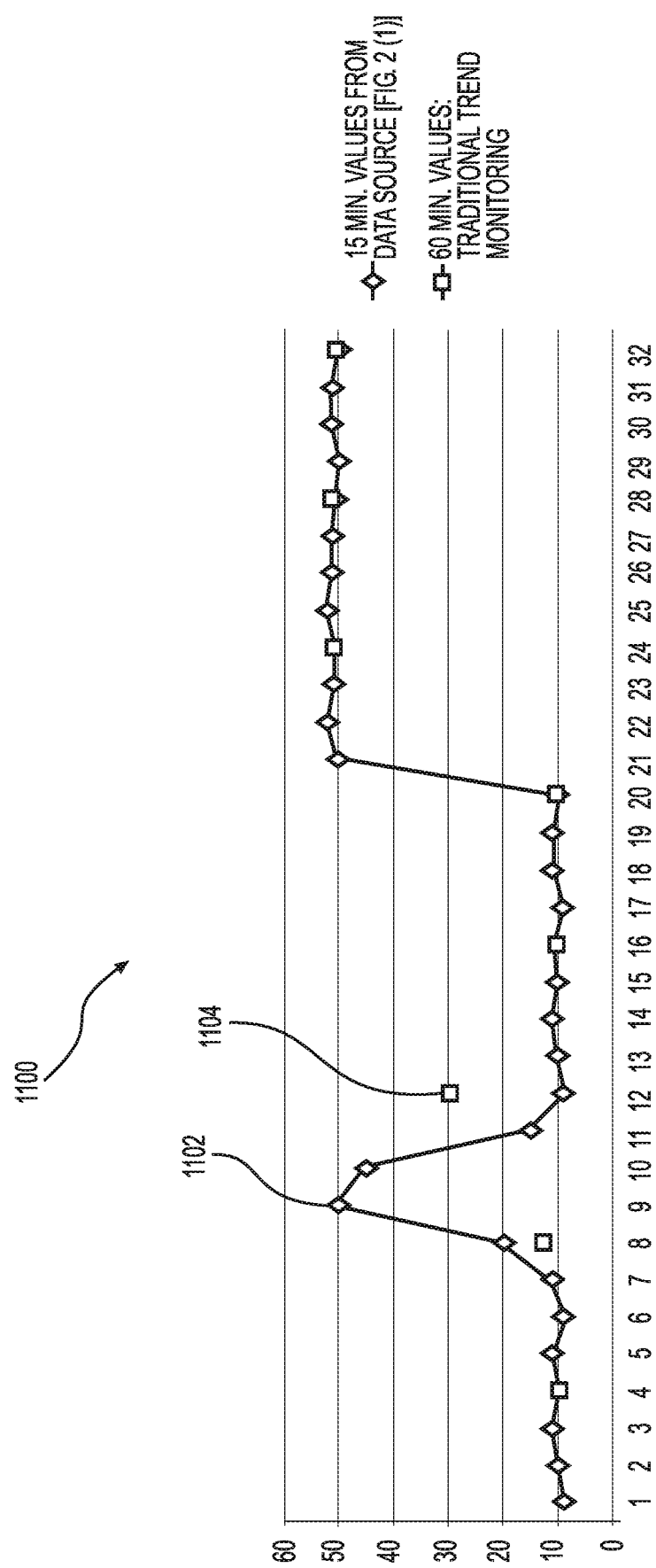
FIG. 11 illustrates a data graph of an example data set in accordance with an exemplary embodiment.

In addition, illustrated in FIG. 11 are eight (8) 60 minute average data values 1104 which are indicative of values that might have been produced by a traditional trend monitoring approach, configured for 60 minute trend data intervals. This is provided to give a simple comparison to one configuration of traditional trend monitoring. Careful review will illustrate how traditional trend monitoring can obscure significant changes in data.

Detecting Levels and Transitions

Figure 12:
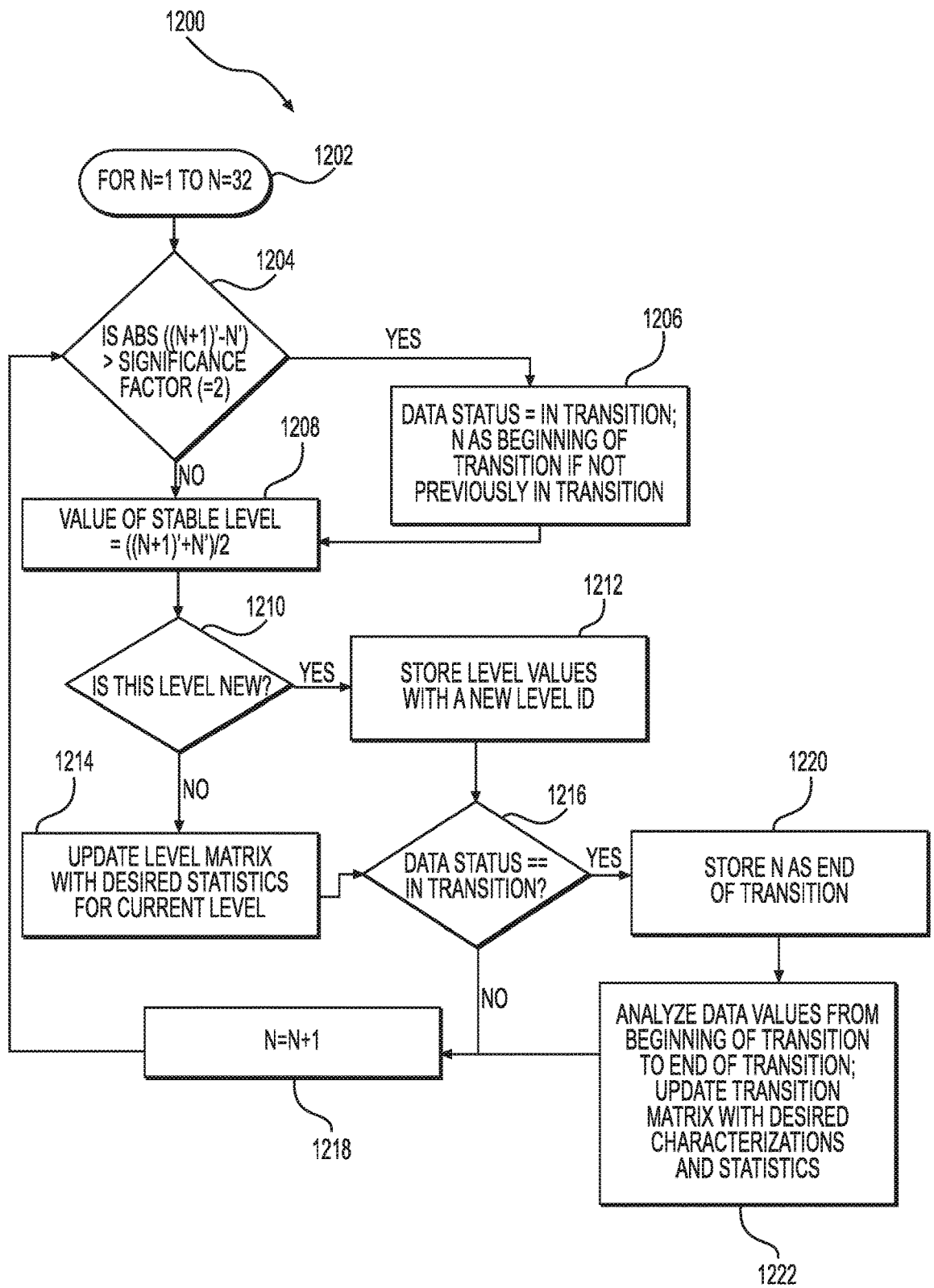
FIG. 12 illustrates an example trend pattern monitoring method in accordance with an exemplary embodiment.

The method for monitoring a trend pattern of a variable, as illustrated in FIG. 10, is now described in more detail in the method 1200 illustrated FIG. 12. The results produced by the steps of method 1200 are illustrated in Table 1.

calculated absolute value is determined to be greater than the significance value, then the status of the current value is flagged as being in transition at step 1206, as illustrated in the $5^{th}$ column of Table 1. The stable level value is then calculated and recorded, in step 1208 by adding the current value to the previous value and dividing the total by 2. This is illustrated in the $6^{th}$ column of Table 1.

At step 1210 it is determined whether the calculated stable level value is new. If it is a new level, the level value is stored with a new level ID in step 1212. Otherwise, the level

TABLE 1

Example Results of Data Processing

| 15 Min. Values From Data Source [FIG. 2 (1)] | 60 Min Values: Traditional Trend Monitoring | N | Change Detection Calculation: abs(value(N + 1) − value(N)) [FIG. 4(1)] | >2? (in transition?) [FIG. 4(1)] | Stable Level Value Calculation: (value(N + 1) + value(N))/2 [FIG. 4 (3)] | New Level? [FIG. 4 (4)] | Level Matrix Processing [FIG. 4 (5) & (6)] | Transition Matrix Processing [FIG. 4 (2) & (8)] |
|---|---|---|---|---|---|---|---|---|
| 9 |    | 1 | 1 | No | 9.5 | Yes | Create level #1 |    |
| 10 |   | 2 | 1 | No | 10.5 | No | Update level #1 |    |
| 11 |   | 3 | 1 | No | 10.5 | No | Update level #1 |    |
| 10 | 10 | 4 | 1 | No | 10.5 | No | Update level #1 |    |
| 11 |   | 5 | 2 | No | 10 | No | Update level #1 |    |
| 9 |    | 6 | 2 | No | 10 | No | Update level #1 |    |
| 11 |   | 7 | 9 | Yes |   |    |    | 7 is start of transition |
| 20 | 13 | 8 | 30 | Yes |    |    |    |    |
| 50 |   | 9 | 5 | Yes |    |    |    |    |
| 45 |   | 10 | 30 | Yes |   |    |    |    |
| 15 |   | 11 | 6 | Yes |    |    |    |    |
| 9 | 30 | 12 | 1 | No | 9.5 | No | Update level #1 | 12 is end transition Analyze and create Transition #1 |
| 10 |   | 13 | 1 | No | 10.5 | No | Update level #1 |    |
| 11 |   | 14 | 1 | No | 10.5 | No | Update level #1 |    |
| 10 |   | 15 | 1 | No | 10.5 | No | Update level #1 |    |
| 11 | 11 | 16 | 2 | No | 10 | No | Update level #1 |    |
| 9 |    | 17 | 2 | No | 10 | No | Update level #1 |    |
| 11 |   | 18 | 0 | No | 11 | No | Update level #1 |    |
| 11 |   | 19 | 1 | No | 10.5 | No | Update level #1 |    |
| 10 | 10 | 20 | 40 | Yes |    |    |    | 20 is start of transition |
| 50 |   | 21 | 2 | No | 51 | Yes | Create level #2 | 21 is end of transition Analyze and create Transition #2 |
| 52 |   | 22 | 1 | No | 51.5 | No | Update level #2 |    |
| 51 |   | 23 | 0 | No | 51 | No | Update level #2 |    |
| 51 | 51 | 24 | 1 | No | 51.5 | No | Update level #2 |    |
| 52 |   | 25 | 1 | No | 51.5 | No | Update level #2 |    |
| 51 |   | 26 | 0 | No | 51 | No | Update level #2 |    |
| 51 |   | 27 | 1 | No | 50.5 | No | Update level #2 |    |
| 50 | 51 | 28 | 0 | No | 50 | No | Update level #2 |    |
| 50 |   | 29 | 1 | No | 50.5 | No | Update level #2 |    |
| 51 |   | 30 | 0 | No | 51 | No | Update level #2 |    |
| 51 |   | 31 | 1 | No | 50.5 | No | Update level #2 |    |
| 50 | 51 | 32 |   |   |    |    |    |    |

At step 1202, source data is continuously collected and processed. In the example illustrated, 32 values or data points are processed. It should be appreciated that 'N' represents the reference index of the sequential data values produced by the data source and 'N'' (or N prime) represents the data source value referred to by N. For example, when N=1, N'=9. Careful review of FIG. 12 and Table 1 should adequately instruct appropriate practitioners in how to process values from a data source up to the point of being ready to create or update level and transition matrices.

At step 1204, it is determined whether a significant or relevant change in the data being collected has occurred. This is done by calculating the absolute value of the difference between the current data value and the previous data value, which is represented in the 4th column of Table 1. This is then compared with the significance factor. If the matrix is updated with the desired statistics for the current level in step 1214, illustrated in the $8^{th}$ column of Table 1.

At step 1216 it is determined whether the status of the current value was flagged as being in transition at step 1206. If the status was not flagged as being in transition, then the next value from the source data is read at step 1218 and the method 1200 repeats again starting at step 1204. But if the status of the current value was flagged as being in transition, then a reference N to the current value is stored as the end of the transition in step 1220, as illustrated in $9^{th}$ column of Table 1. The data values from the beginning of the transition to the end of the transition are then analyzed and the transition matrix is updated with desired characterizations and statistics in step 1222.

In this example, the value of 2 was given as the value that indicates significant (relevant) change (significance factor)

in sequential data values for this unique example. The significance factor, surge factor, and ramp factor must be determined for each monitored variable and system by appropriate practitioners, based upon the known or expected system characteristics and monitoring objectives, for example. It should be appreciated that larger values of significance factor will result in less granular pattern matrices data, and vice versa. "Appropriate practitioners" are those with the necessary skills to develop monitoring systems, and a desire to apply the trend pattern monitoring technique within a monitoring system.

Level Matrix Processing

Continuing with the same example and using the example data set, calculations, and status indications shown in Table 1, Table 2 shows how example level matrix data would evolve as the example source data (From N=1 to N=31) is processed according to the method 1200 of FIG. 12. Tables 4 and 5, show what the content of the level matrix data file could be after N=2 and N=31, respectively. It should be appreciated that these are only 2 of 31 file updates that would take place, provided as instructional reference points. It should be further appreciated that the one matrix data file would have been updated 31 times as indicated by steps 1212 and 1214 in FIG. 12, as the processing progressed from N=1 to N=31.

TABLE 2

Example Level Matrix Data Sequential Evolution

| N | Level # | Level Values Count | Level Max. Value | Level Avg. Value | Level Min. Value | Level Std. Dev. |
|---|---|---|---|---|---|---|
| 1 | 1 | 1 | 9 | 9 | 9 | |
| 2 | 1 | 2 | 11 | 9.5 | 9 | 0.707107 |
| 3 | 1 | 3 | 11 | 10 | 9 | 1 |
| 4 | 1 | 4 | 11 | 10 | 9 | 0.816497 |
| 5 | 1 | 5 | 11 | 10.2 | 9 | 0.83666 |
| 6 | 1 | 6 | 11 | 10 | 9 | 0.694427 |
| 7 | | Data in transition. Level matrix NOT updated | | | | |
| 8 | | | | | | |
| 9 | | | | | | |
| 10 | | | | | | |
| 11 | | | | | | |
| 12 | 1 | 7 | 11 | 9.857143 | 9 | 0.699735 |
| 13 | 1 | 8 | 11 | 9.875 | 9 | 0.834523 |
| 14 | 1 | 9 | 11 | 10 | 9 | 0.866025 |
| 15 | 1 | 10 | 11 | 10 | 9 | 0.816497 |
| 16 | 1 | 11 | 11 | 10.09091 | 9 | 0.831209 |
| 17 | 1 | 12 | 11 | 10 | 9 | 0.852803 |
| 18 | 1 | 13 | 11 | 10.07692 | 9 | 0.862316 |
| 19 | 1 | 14 | 11 | 10.14286 | 9 | 0.864438 |
| 20 | | Data in transition. Level matrix NOT updated | | | | |
| 21 | 1 | 14 | 11 | 10.14286 | 9 | 0.864438 |
| | 2 | 1 | 50 | 50 | 50 | |
| 22 | 1 | 14 | 11 | 10.14286 | 9 | 0.864438 |
| | 2 | 2 | 52 | 51 | 50 | 1.414214 |
| 23 | 1 | 14 | 11 | 10.14286 | 9 | 0.864438 |
| | 2 | 3 | 52 | 51 | 50 | 1 |
| 24 | 1 | 14 | 11 | 10.14286 | 9 | 0.864438 |
| | 2 | 4 | 52 | 51 | 50 | 0.816497 |
| 25 | 1 | 14 | 11 | 10.14286 | 9 | 0.864438 |
| | 2 | 5 | 52 | 51.2 | 50 | 0.83666 |
| 26 | 1 | 14 | 11 | 10.14286 | 9 | 0.864438 |
| | 2 | 6 | 52 | 51.16667 | 50 | 0.752773 |
| 27 | 1 | 14 | 11 | 10.14286 | 9 | 0.864438 |
| | 2 | 7 | 52 | 51.14286 | 50 | 0.690066 |
| 28 | 1 | 14 | 11 | 10.14286 | 9 | 0.864438 |
| | 2 | 8 | 52 | 51 | 50 | 0.755929 |
| 29 | 1 | 14 | 11 | 10.14286 | 9 | 0.864438 |
| | 2 | 9 | 52 | 50.88889 | 50 | 0.781736 |
| 30 | 1 | 14 | 11 | 10.14286 | 9 | 0.864438 |
| | 2 | 10 | 52 | 50.9 | 50 | 0.737865 |
| 31 | 1 | 14 | 11 | 10.14286 | 9 | 0.864438 |
| | 2 | 11 | 52 | 50.90909 | 50 | 0.700649 |

TABLE 3

Example Level Matrix Data File Content at N = 2

| N | Level # | Level Values Count | Level Max. Value | Level Avg. Value | Level Min. Value | Level Std. Dev. |
|---|---|---|---|---|---|---|
| 2 | 1 | 2 | 11 | 9.5 | 9 | 0.707107 |

TABLE 4

Example Level Matrix Data File Content at N = 31

| N | Level # | Level Values Count | Level Max. Value | Level Avg. Value | Level Min. Value | Level Std. Dev. |
|---|---|---|---|---|---|---|
| 2 | 1 | 2 | 11 | 9.5 | 9 | 0.707107 |

Transition Matrix Processing

Continuing with the same example data set, the data processing results shown in Table 1 indicate that two transitional periods in the trend data illustrated in FIG. 11 would have been identified during the 31 passes through the processing loop shown in FIG. 12. The first transitional period start point was identified at N=7 during execution of step 1206, with an end point identified at N=12 during execution of step 1220. This results in a first transitional data set (Transition #1) to be analyzed, with data as shown in Table 5.

TABLE 5

Example Transition #1

| 15 Min. Values From Data Source | N |
|---|---|
| 11 | 7 |
| 20 | 8 |
| 50 | 9 |
| 45 | 10 |
| 15 | 11 |
| 9 | 12 |

In the same way, the second transitional period would have been determined to have a start point at N=20, with an end point at N=21, resulting in a second transitional data set (Transition #2), with data as shown in Table 6.

TABLE 6

Example Transition #2

| 15 Min. Values From Data Source | N |
|---|---|
| 10 | 20 |
| 50 | 21 |

Figure 13:
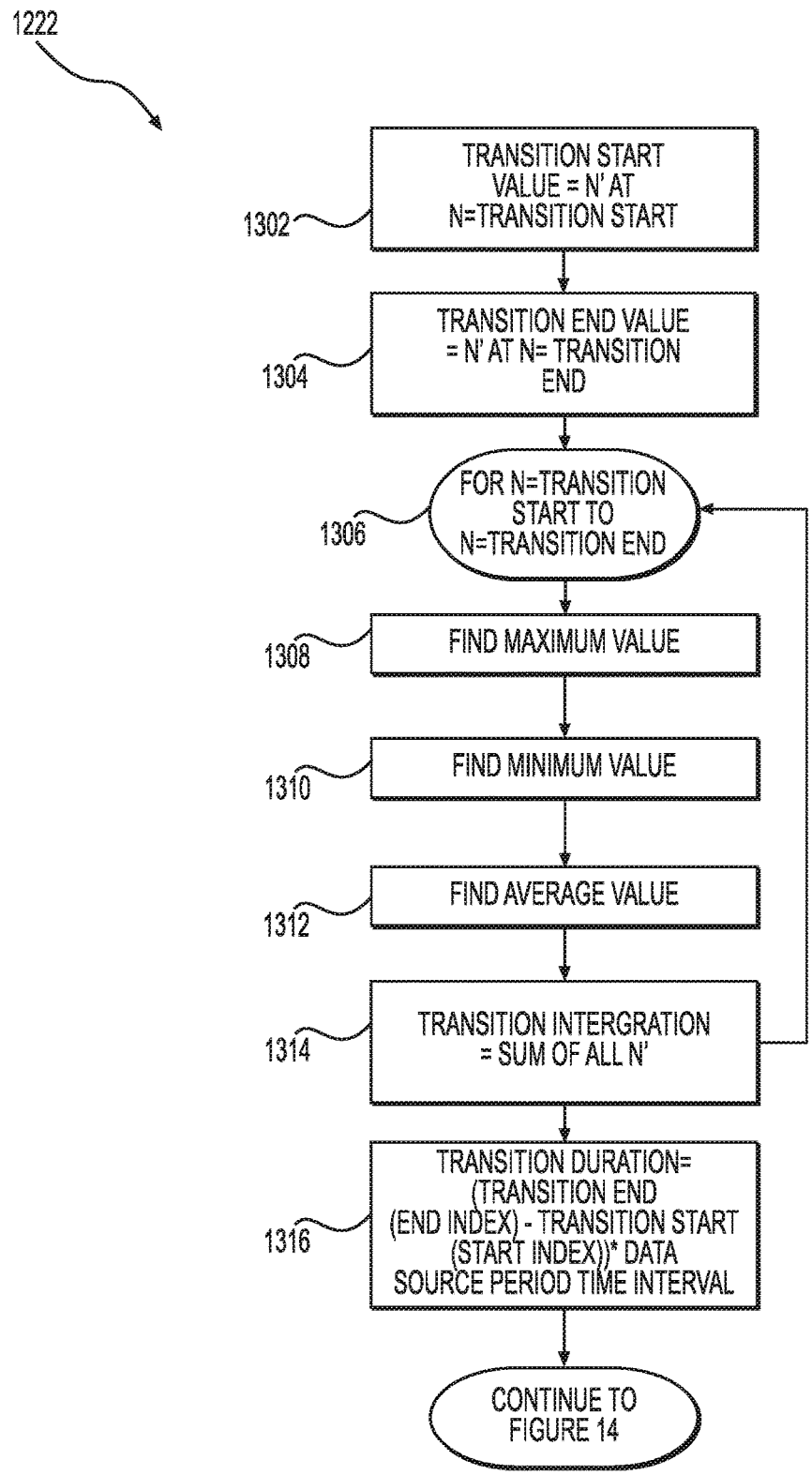
FIG. 13 illustrates an example trend pattern monitoring method in accordance with an exemplary embodiment.
Figure 14:
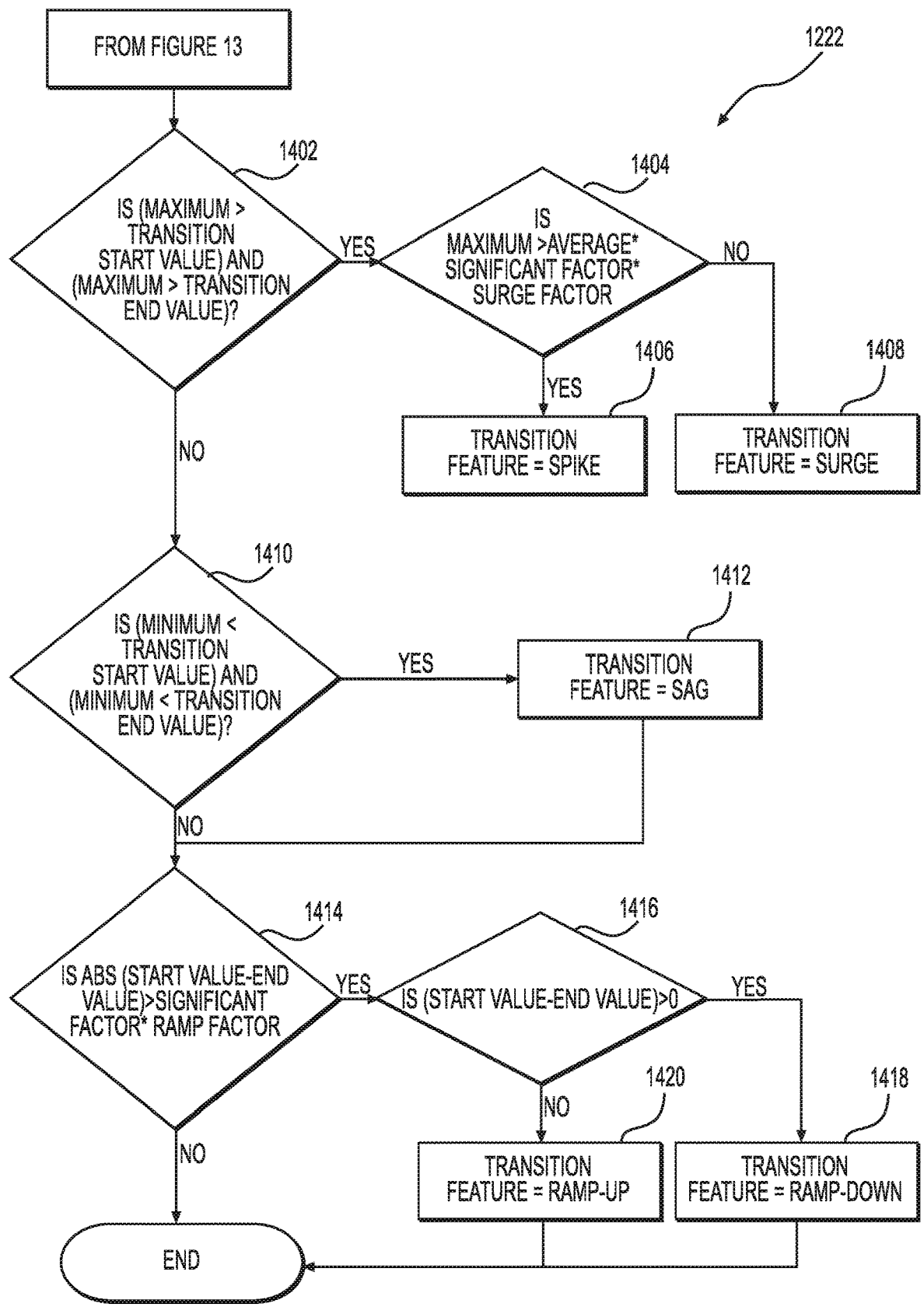
FIG. 14 illustrates an example trend pattern monitoring method in accordance with an exemplary embodiment.

For both transitions, the identification of a transition end point at step 1220 in FIG. 12 triggers analysis of the transitional data as indicated by step 1222 of FIG. 12. FIGS. 13 and 14 illustrate step 1222 of FIG. 12 in more detail. The steps shown in FIG. 13 would be first applied to extract appropriate calculations from the transitional data source values. In particular, at step 1302, the transition start value is set and at step 1304 the transition end value is set. The steps, starting at step 1306 and including steps 1308, 1310, 1312, and 1314 are then repeated for all data values within the transition. In particular, at step 1308, the maximum value is identified. At step 1310, the minimum value is identified. At step 1312, the average value is identified. At step 1314, a transition integration value is calculated by adding all of the data values. At step 1316, a transition duration is calculated according to the following formula:

Transition Duration=(transition end(end index)−transition start(start index))*data source period time interval     Formula(1):

The steps shown in FIG. 14 would then be applied to the results of the steps in FIG. 13, to determine important "features" that categorize a particular transition. In particular, at step 1402, it is determined whether the maximum is greater than the start value and the maximum is greater than the transition end value. If it is, then at step 1404 it is determined whether the maximum is greater than the average multiplied by the significant factor (same as significance factor) and the surge factor. If it is, then at step 1406 a transition feature is identified as a Spike. Otherwise, at step 1408 a transition feature is identified as a Surge.

At step 1410, it is determined whether the minimum is less than the transition start value and less than the transition end value. If it is, then a transition feature is identified as a Sag at step 1412.

At step 1414 it is determined whether the absolute value of the difference between the start value and the end value is greater than the significant factor multiplied by the ramp factor. If it is, then it is determined at step 1416 whether end value subtracted from the start value is greater than zero. If it is, then a transition feature is identified at step 1418 as Ramp-Down. Otherwise, a transition feature is identified as Ramp-Up at step 1420.

Table 7 shows the calculations that would result from the processing shown in FIG. 13 for the first transition (N=7 through N=12), while Table 8 shows the calculations that would result for the second transition (#2, N=20 through N=21).

TABLE 7

Example Values Calculated for Transition #1

| | |
|---|---|
| Start Value (N = 7) | 11 |
| End Value (N = 12) | 9 |
| Max. | 50 |
| Min. | 9 |
| Average | 25 |
| Integration | 150 |
| Duration | 75 |

TABLE 8

Example Values Calculated for Transition #2

| | |
|---|---|
| Start Value (N = 20) | 10 |
| End Value (N = 21) | 50 |
| Max. | 50 |
| Min. | 10 |
| Average | 30 |
| Integration | 60 |
| Duration | 15 |

As previously indicated, the following factors were predetermined for the example calculations described: Significance factor=2; Surge factor=1.5; and Ramp factor=2. In this example, the surge factor is a constant that is applied to determine if a transition has features of "surge" or "spike". The spike feature will differ from the surge feature only in maximum magnitude in comparison to the average. The ramp factor is a constant that is applied to determine if a transition has features of "ramp-up" or "ramp-down". These constants must be determined by appropriate practitioners for the specific requirements of each monitoring system. It should be appreciated that in application, different or additional factors, similar in concept, may be employed.

Table 9 shows the intermediate calculations, comparisons, and values, as well as the resulting transition features that would have been detected for both Transitions #1 and #2 by the step shown in FIG. 14. Note that the steps of FIG. 14 use the data shown in Tables 7 and 8 that resulted from the steps shown in FIG. 13.

TABLE 9

Example Determination Of Transition Features

| Transition # | Is (Max > Transition Start Value) and (Max > Transition End Value)? | Average* Surge Factor* Significance Factor(C1) | Is Max > (C1) | Transition Feature (Spike or Surge) | Is (Min < Transition Start Value) and (Min. < Transition End Value)? | Transition Feature (Sag) | Transition Start Value − Transition End Value (C2) | Is ABS(C2) > (Significance Factor*Ramp Factor)? | Is (C2) > 0? | Transition Feature (Ramp-up or Ramp-down) |
|---|---|---|---|---|---|---|---|---|---|---|
| 1 | Is (50 > 11) and (50 is > 9 => YES | 25*1.5*2 = 75 | Is 50 > 75 => NO | SURGE | Is (9 > 11) and (9 > 9) => NO | (not sag) | 11 − 9 = 2 | Is 2 > 2*1.5 => NO | NA | (not ramp-up or rampdown) |

TABLE 9-continued

Example Determination Of Transition Features

| Transition # | Is (Max > Transition Start Value) and (Max > Transition End Value)? | Average* Surge Factor* Significance Factor(C1) | Is Max > (C1) | Transition Feature (Spike or Surge) | Is (Min < Transition Start Value) and (Min. < Transition End Value)? | Transition Feature (Sag) | Transition Start Value – Transition End Value (C2) | Is ABS(C2) > (Significance Factor*Ramp Factor)? | Is (C2) > 0? | Transition Feature (Ramp-up or Ramp-down) |
|---|---|---|---|---|---|---|---|---|---|---|
| 2 | Is (50 > 10) and (50 > 50) => NO | NA | NA | (not spike or surge) | Is (10 > 10) and (10 > 50) => NO | (not sag) | 10 – 50 = –40 | Is 40 > 2*1.5 => YES | Is –40 > 0 => NO | RAMP-UP |

Note that Transition #1 was determined to have a SURGE feature, while Transition #2 was determined to have a RAMP-UP feature. In actual application, transitions will often have more than one feature, such as both surge and ramp-up. Appropriate practitioners will create various additional features as needed to meet the requirements of each unique monitoring system.

Table 10 shows example transition matrix data file content that could have been produced immediately after the data processing steps shown in FIG. 14 after N=12 (end of Transition #1).

TABLE 10

Example Transition Matrix Data File Content ay N = 12

| Transition # | Feature | Characteristics | | | | |
|---|---|---|---|---|---|---|
| | | Start Index | End Index | Duration | Maximum | Integration | Count |
| 1 | Surge | 7 | 12 | 75 Minutes | 50 | 150 | 1 |

Similarly, Table 11 shows example transition matrix data file content that could have been created after the data processing steps shown in FIG. 14 after N=21 (end of Transition #2). Note the characteristics chosen for inclusion with each transitional feature. Many other characteristics might have been included, as will be obvious to appropriate practitioners, based upon the requirements for each unique monitoring application.

TABLE 11

Example Transition Matrix Data File Content ay N = 21

| Transition # | Feature | Characteristics | | | | |
|---|---|---|---|---|---|---|
| | | Start Index | End Index | Duration | Maximum | Integration | Count |
| 1 | Surge | 7 | 12 | 75 Minutes | 50 | 150 | 1 |
| 2 | Ramp-up | 20 | 21 | 15 Minutes | 50 | 60 | 1 |

It should be appreciated that the characteristics shown in Tables 10 and 11 have been deliberately simplified to facilitate instruction. In practical application, most of the characteristics would be expanded to a set of statistical values such as maximum, average, minimum, and standard deviation. This would be done to permit statistical aggregation of similar transitions. Similar transitions could be ones that have the same feature set, such as one surge and one ramp-up. When a transition is found to be similar to a previous transition, a practitioner might chose to update the statistical values of characteristics associated with each feature for this transition type. Note the COUNT data column in Tables 10 and 11. This was included to indicate that more than one of a particular transition might be aggregated into the transition matrix data file.

It should be further appreciated that practitioners might choose to define similarity of transitions as more specific than only matching feature sets. For example, for a new transition to be similar to a previously found transition type, some set of characteristic statistical values might need to be within a predefined number of standard deviations of the existing transition type.

It should also be appreciated that, although certain data sets have described herein, practitioners may desire to create data files containing all data source values associated with transitions. Such data sets might include data similar to that shown in Tables 5-8. Such data sets might be created for all transitions, new transitions only, or transitions of predefine type. Such data sets could be persistently stored to facilitate more detailed analysis when needed.

Application Considerations

It should be appreciated that in the application example, the given periodic data source interval of 15 minutes is a familiar but arbitrary choice for purposes of the example. The subject data processing technique will work similarly for any periodic data interval, including very high speed data sources.

Trend pattern monitoring can be a very efficient technique for continuously monitoring any variable which is normally expected to trend at various stable levels. Most electric motor-driven systems, for example, normally operate at only several different power levels during normal operational cycles. Many simple motor driven systems are either on or off such that only two stable power levels are normally expected. More complex motor-driven systems may also have different power loading levels, depending upon the process, but the total number of normally expected power levels is relatively few. The expected operation of most electric motor-driven systems is generally characterized by steady, stable power consumption at only a few different levels.

Expected stability of the target variable to be monitored, as well as the value of more detailed transitional data, should be evaluated to determine if trend pattern monitoring is desirable, as compared to traditional trend monitoring.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A trend pattern monitoring system for diagnosing one or more operational states of an electrically operated object in real time by monitoring a trend pattern of an operational electrical parameter of the object in said one or more operational states, said one or more operational states including a start-up stage, a transition stage, and a steady-state stage, and said operational electrical parameter including at least one of voltage and current, comprising:
   a processor communicatively coupled to a power load wire of said electrically operated object; and
   a computer-readable storage medium having stored therein instructions which, when executed by the processor, cause the processor to:
      obtain respective electrical measurements of said electrically operated object during said one or more operational states,
      based on the respective electrical measurements, determine respective electrical patterns of said respective electrical measurements that correspond to said one or more operational states,
      compare the respective electrical patterns corresponding to said one or more operational states with respective baseline electrical patterns modeled for said one or more operational states to yield a comparison result,
      determine a status of said electrically operated object based on the comparison result,
      based on the comparison result, output to a display an indication of said status of said electrically operated object; and
      identify an inefficiency or malfunction in said one or more operational states of the electrically operated object as indicated by the displayed indication prior to failure of the electrically operated object.

2. The system of claim 1, wherein the computer-readable storage medium stores additional instructions which, when executed by the processor, cause the processor to model the respective baseline electrical patterns for said one or more operational states by:
   obtaining baseline electrical measurements of the monitored system corresponding to said one or more operational states of the electrically operated object and captured when the electrically operated object is operating above a threshold performance level to yield baseline electrical parameters; and
   based on the baseline electrical parameters, determining the respective baseline electrical patterns for said one or more operational states.

3. The system of claim 2, wherein the respective electrical measurements are captured at a first time, the computer-readable storage medium storing additional instructions which, when executed by the processor, cause the processor to model the respective electrical baseline patterns for said one or more operational states by:
   obtaining, at a second time that is different than the first time, baseline electrical measurements of the monitored system corresponding to said one or more operational states of the monitored system, wherein the second time is determined based on one of a usage history of the monitored system, a status of the monitored system, performance of the monitored system, and a maintenance status of the monitored system to yield baseline electrical parameters corresponding to the second time; and
   based on the baseline baseline electrical parameters corresponding to the second time, determining the respective baseline electrical patterns for said one or more operational states.

4. The system of claim 1, wherein each of the respective electrical patterns comprises one or more specific characteristics of consumption at a corresponding one of said one or more operational states, the one or more specific characteristics comprising at least one of a load voltage and a load current.

5. A non-transitory computer-readable storage medium having stored therein instructions which, when executed by a processor, cause the processor to:
   obtain respective electrical measurements of an electrically operated object during one or more operational states including a start-up stage, a transition stage, and a steady-state stage;
   based on the respective electrical measurements, determine respective electrical patterns of said respective electrical measurements that correspond to said one or more operational states;
   compare the respective electrical patterns corresponding to said one or more operational states with respective baseline electrical patterns modeled for said one or more operational states to yield a comparison result;
   determine a status of said electrically operated object based on the comparison result;

based on the comparison result, output to a display an indication of said status of said electrically operated object; and identify an inefficiency or malfunction in said one or more operational states of the electrically operated object as indicated by the displayed indication prior to failure of the electrically operated object.

6. The non-transitory computer-readable storage medium of claim 5, wherein each of the respective electrical patterns comprises a set of values corresponding to at least one of one or more measured values received from a sensor and one or more values derived based on the one or more measured values, the set of values comprising at least one of:

a stage-specific beginning time or date, a stage-specific duration, a stage-specific total real energy, a stage-specific total reactive energy, a stage-specific harmonic distortion, a stage-specific discrete harmonic component, a stage-specific cycle maximum power, and a stage-specific cycle minimum power factor.

7. The non-transitory computer-readable storage medium of claim 5, wherein the start-up stage comprises a first period where one or more operating parameters of the electrically operated object change from an inactive level, wherein the transition stage comprises a second period where said one or more operating parameters transition from the start-up stage to the steady state stage, wherein the steady-state stage comprises a third period where said one or more operating parameters indicate that a steady-state operation has started based on operation statistics of the electrically operated object, and wherein a shutdown stage comprises a fourth period where said one or more operating parameters indicate a decrease thereof.

8. The non-transitory computer-readable storage medium of claim 5, wherein each of the respective electrical patterns comprises one or more specific characteristics of consumption at a corresponding one of said one or more operational states, the one or more specific characteristics comprising at least one of a load voltage and a load current.

9. A method for diagnosing one or more operational states of an electrically operated object in real time by monitoring a trend pattern of a physical operational parameter of the electrically operated object within said one or more operational states, said one or more operational states including a start-up stage, a transition stage, and a steady-state stage, said physical operational parameter including at least one of voltage and current, the method comprising:

continuously collecting in each of said one or more operational states and by a processor of an electrical pattern monitoring (ePM) device connected to at least one of a current sensor and a voltage sensor coupled to a power load wire of said electrically operated object, data values of ; from the electrically operated object from said at least one of a current sensor and a voltage sensor, said ePM device further including an output configured to transmit data to a remote device;

monitoring, by said processor, for changes in value levels in the collected data and determining whether a detected change is greater than a predetermined significance factor;

responsive to determining that a collected data value is stable by detecting that the change is less than the predetermined significance factor, creating or updating a level matrix with data corresponding to characteristics of the collected stable data value;

responsive to determining that a collected data value is in transition between stable levels by detecting that the change is greater than the predetermined significance factor, creating or updating a transition matrix with data corresponding to characteristics of the collected transitional data value;

forming, for each of said one or more operational states, said trend pattern as an operational electrical pattern of the physical operational parameter by combining data associated with the level matrix with data associated with the transition matrix;

analyzing, by said processor, the operational electrical pattern to derive an indicator indicating a status of the electrically operated object in said one or more operational states;

outputting the indicator, from said output of the said ePM device, to a display of said remote device; and correcting an inefficiency or malfunction in said one or more operational states of the electrically operated object as indicated by the indicator prior to failure of the electrically operated object.

* * * * *